US012800631B2

(12) United States Patent
Cai et al.

(10) Patent No.: US 12,800,631 B2
(45) Date of Patent: Nov. 17, 2026

(54) DISPLAY DEVICE AND TEST METHOD THEREFOR

(71) Applicant: Xiamen Tianma Optoelectronics Co., Ltd., Xiamen (CN)

(72) Inventors: Zhongming Cai, Xiamen (CN); Zongjun Zou, Xiamen (CN); Jinquan Liu, Xiamen (CN); Xuhui Peng, Xiamen (CN)

(73) Assignee: Xiamen Tianma Optoelectronics Co., Ltd., Xiamen (CN)

(*) Notice: Subject to any disclaimer, the term of this patent is extended or adjusted under 35 U.S.C. 154(b) by 104 days.

(21) Appl. No.: 19/094,625

(22) Filed: Mar. 28, 2025

(65) Prior Publication Data

US 2025/0224432 A1 Jul. 10, 2025

(30) Foreign Application Priority Data

Nov. 22, 2024 (CN) ......................... 202411686634.7

(51) Int. Cl.

| | |
|---|---|
| ***G01R 27/02*** | (2006.01) |
| ***G09G 3/00*** | (2006.01) |
| ***G09G 3/36*** | (2006.01) |

(52) U.S. Cl.

CPC ............. *G01R 27/02* (2013.01); *G09G 3/006* (2013.01); *G09G 2330/12* (2013.01)

(58) Field of Classification Search

CPC .... G01R 27/02; G09G 3/006; G09G 2330/12; H05K 1/116

See application file for complete search history.

(56) References Cited

U.S. PATENT DOCUMENTS

2016/0202298 A1* 7/2016 Brahma ............... G01R 27/205
345/206

FOREIGN PATENT DOCUMENTS

| | | | | |
|---|---|---|---|---|
| CN | 105702188 A | | 6/2016 | |
| CN | 113160729 A | | 7/2021 | |
| KR | 20110024260 | * | 3/2011 | |
| KR | 102040660 B1 | * | 11/2019 | ............. H05K 1/118 |

* cited by examiner

*Primary Examiner* — Alesa Allgood
(74) *Attorney, Agent, or Firm* — KDW FIRM PLLC

(57) ABSTRACT

A display device includes a substrate and a metal layer, and is bonded to a driver chip and a flexible circuit board; where first chip pad, first panel pad, first metal wire of the metal layer, second panel pad, first circuit board pad, first internal wire of the flexible circuit board, third circuit board pad, and first control board pad connected in sequence to form first branch; second metal wire of the metal layer, third panel pad, second circuit board pad, second internal wire of the flexible circuit board, fourth circuit board pad, and second control board pad connected in sequence to form second branch; first chip pads of two first branches electrically connected through third metal wire of the metal layer to form first test loop; and second metal wires of two second branches electrically connected through fourth metal wire of the metal layer to form second test loop.

20 Claims, 13 Drawing Sheets

DISPLAY DEVICE AND TEST METHOD THEREFOR

CROSS-REFERENCE TO RELATED APPLICATION(S)

This application claims priority to Chinese Patent Application No. 202411686634.7 filed Nov. 22, 2024, the disclosure of which is incorporated herein by reference in its entirety.

TECHNICAL FIELD

The present disclosure relates to the field of display technology and, in particular, to a display device and a test method therefor.

BACKGROUND

A display panel needs to be bonded to a driver chip (for example, an integrated circuit (IC)) that provides drive signals for a display region. Generally, the IC is bonded in two manners. The first manner is chip on film (COF), where the IC is fixed to a flexible circuit board (for example, a flexible printed circuit (FPC)), and the FPC is bonded to a substrate of the display panel. The second manner is chip on glass (COG), where the IC is bonded to a glass substrate of the display panel, and the FPC is bonded to a substrate of the display panel to be electrically connected to the IC. After the IC is bonded, the flexible circuit board (for example, the FPC) is connected to a control circuit board (for example, a printed circuit board (PCB)).

During bonding, a bonding resistance value between a terminal (for example, a pad) of the display panel and an IC pad and a bonding resistance value between a terminal (for example, a pad) of the display panel and an FPC pad affect the connection effect between the display panel and the control circuit board. Therefore, the bonding resistance value after bonding needs to be detected.

In the related art, an IC bonding resistance value of an in-vehicle display device cannot be directly measured and is calculated according to theoretical values. A total resistance value of an entire test loop may be tested through test terminals disposed on the PCB, and other resistance values such as the bonding resistance value of the FPC pad, a bonding resistance value of a PCB pad, and a resistance value of an in-plane wire in the test loop are subtracted from the total resistance value so that the IC bonding resistance value is obtained. The bonding resistance value of the FPC pad can be directly measured at an FPC impedance test terminal, but the resistance value of the in-plane wire needs to be actually measured through pad pricks, which waste a lot of time and energy and are inconvenient to operate.

SUMMARY

Embodiments of the present disclosure provide a display device and a test method therefor, so as to accurately measure an IC bonding resistance value in a simpler manner.

In a first aspect, embodiments of the present disclosure provide a display device. The display device includes a substrate and a metal layer disposed on the substrate, where the metal layer includes a first panel pad, a second panel pad, and a third panel pad.

The display device is bonded to a driver chip and a flexible circuit board; a first chip pad of the driver chip is bonded to the first panel pad; a first circuit board pad of the flexible circuit board is bonded to the second panel pad; a second circuit board pad of the flexible circuit board is bonded to the third panel pad; a third circuit board pad of the flexible circuit board is bonded to a first control board pad of a control circuit board; and a fourth circuit board pad of the flexible circuit board is bonded to a second control board pad of the control circuit board.

The first chip pad, the first panel pad, a first metal wire of the metal layer, the second panel pad, the first circuit board pad, a first internal wire of the flexible circuit board, the third circuit board pad, and the first control board pad are connected in sequence to form a first branch; a second metal wire of the metal layer, the third panel pad, the second circuit board pad, a second internal wire of the flexible circuit board, the fourth circuit board pad, and the second control board pad are connected in sequence to form a second branch; first chip pads of two first branches are electrically connected through a third metal wire of the metal layer to form a first test loop; and second metal wires of two second branches are electrically connected through a fourth metal wire of the metal layer to form a second test loop; where the length of the first metal wire is substantially the same as the length of the second metal wire.

The control circuit board includes a first test terminal, a second test terminal, a third test terminal, and a fourth test terminal; the first test terminal is electrically connected to the first control board pad at a first end of the first test loop; the second test terminal is electrically connected to the first control board pad at a second end of the first test loop; the third test terminal is electrically connected to the second control board pad at a first end of the second test loop; and the fourth test terminal is electrically connected to the second control board pad at a second end of the second test loop.

In a second aspect, embodiments of the present disclosure provide a test method for a display device. The test method is applicable to the display device of any embodiment of the present disclosure and includes the steps below.

A first resistance value R1 of the first test loop in the display device is measured through the first test terminal and the second test terminal.

A second resistance value R2 of the second test loop in the display device is measured through the third test terminal and the fourth test terminal.

A bonding resistance value R of the first chip pad of the driver chip of the display device is acquired according to the first resistance value R1 and the second resistance value R2, where $R=(R1-R2)/2$.

DETAILED DESCRIPTION

Figure 1:
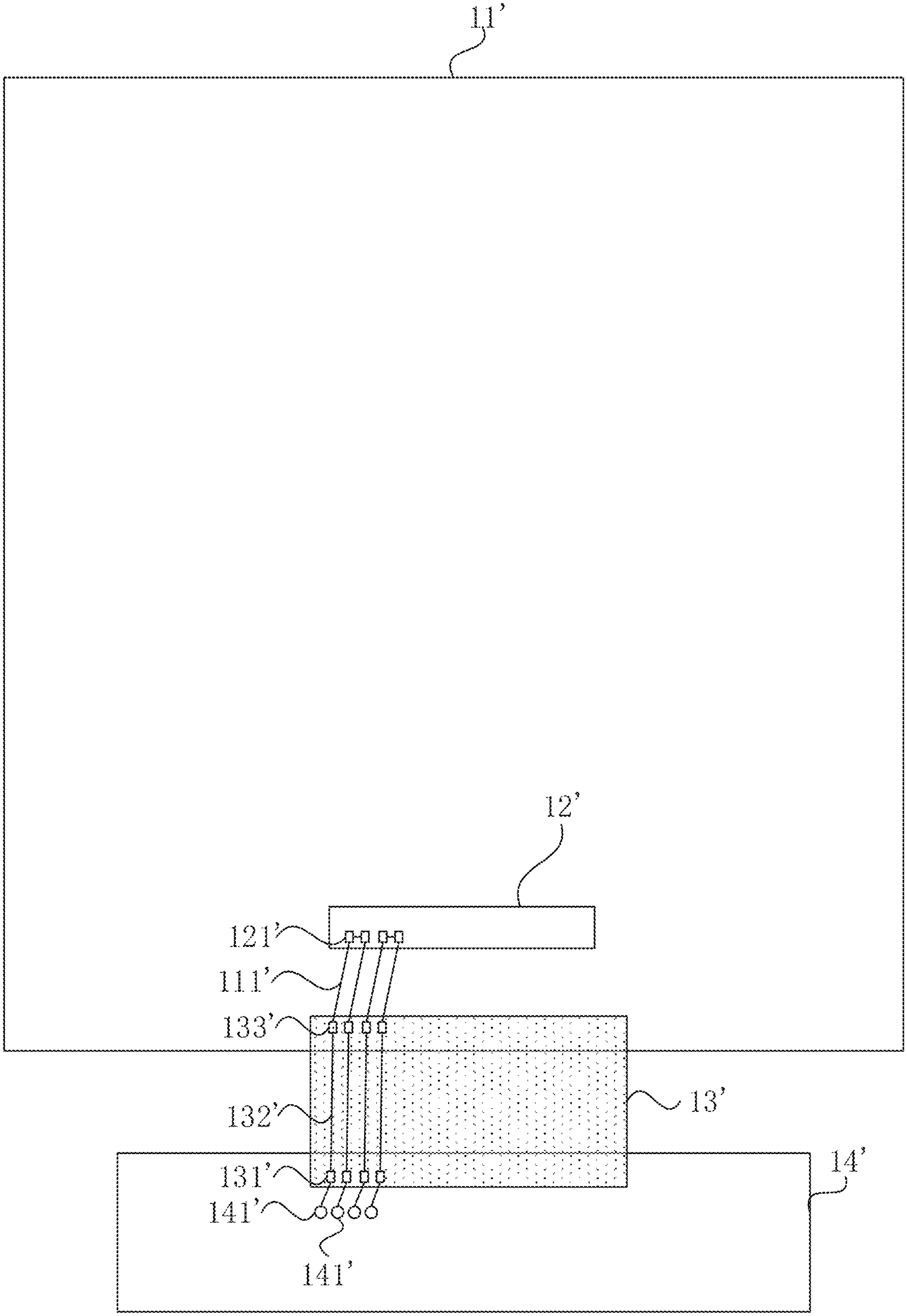
FIG. 1 is a structure diagram of a display device in the related art.

The present disclosure is further described in detail below in conjunction with drawings and embodiments. It is to be understood that the embodiments described herein are intended to illustrate the present disclosure and not to limit the present disclosure. Additionally, it is to be noted that for ease of description, only part, not all, of structures related to the present disclosure are illustrated in the drawings.

FIG. 1 is a structure diagram of a display device in the related art. As shown in FIG. 1, the display device in the related art, especially an in-vehicle device, includes a display panel 11' bonded to a driver chip 12' and a flexible circuit board 13'. The flexible circuit board 13' is configured to perform signal transmission between a control board 14' and the driver chip 12'. Specifically, a signal transmission path includes at least a bonding resistance value R1' between a pad 131' of the flexible circuit board 13' and a pad of the control board 14', a bonding resistance value R2' between a pad 133' of the flexible circuit board 13' and a pad of the display panel 11', a resistance value R3' of an in-plane wire 111' of the display panel 11', and a bonding resistance value R4' between a pad 121' of the driver chip 12' and a pad of the display panel 11'. An internal wire of the flexible circuit board 13' and an internal wire of the control board 14' are both copper wires and have almost zero resistance values that can be ignored, and the resistance value R3' of the in-plane wire 111' is greater than 1 Ω and cannot be ignored. In a design process of the display device, an IC bonding resistance value between the display panel 11' and the driver chip 12' needs to be measured to acquire a chip bonding effect and a signal transmission loss, and an IC bonding resistance value can be optimized according to the measured resistance value, thereby reducing a signal loss. As shown in FIG. 1, the resistance value is estimated according to theoretical values, two adjacent signal transmission paths form a test loop, and R4'=R'−2R1'−2R2'−2R3', where R' denotes a resistance value of the test loop measured between two adjacent test terminals 141'. Resistance values of R1' and R2' may be directly measured at impedance test terminals on the flexible circuit board 13', but the resistance value R3' of the in-plane wire 111' needs to be actually measured through pad pricks with probes. In a process of implementing the present disclosure, the following problems are found: firstly, the actually measured resistance value R3' of the in-plane wire 111' is easy to have a measurement error due to problems of a test position and measurement equipment; secondly, an operator needs a large number of pricks with probes for actual measurement, where in the process, the operator needs to laser two ends of the in-plane wire 111' and then operate the probes under a magnifier. However, it is difficult to perform acupuncture under a magnifying glass, which wastes a lot of time and energy and is not easy to operate.

Figure 2:
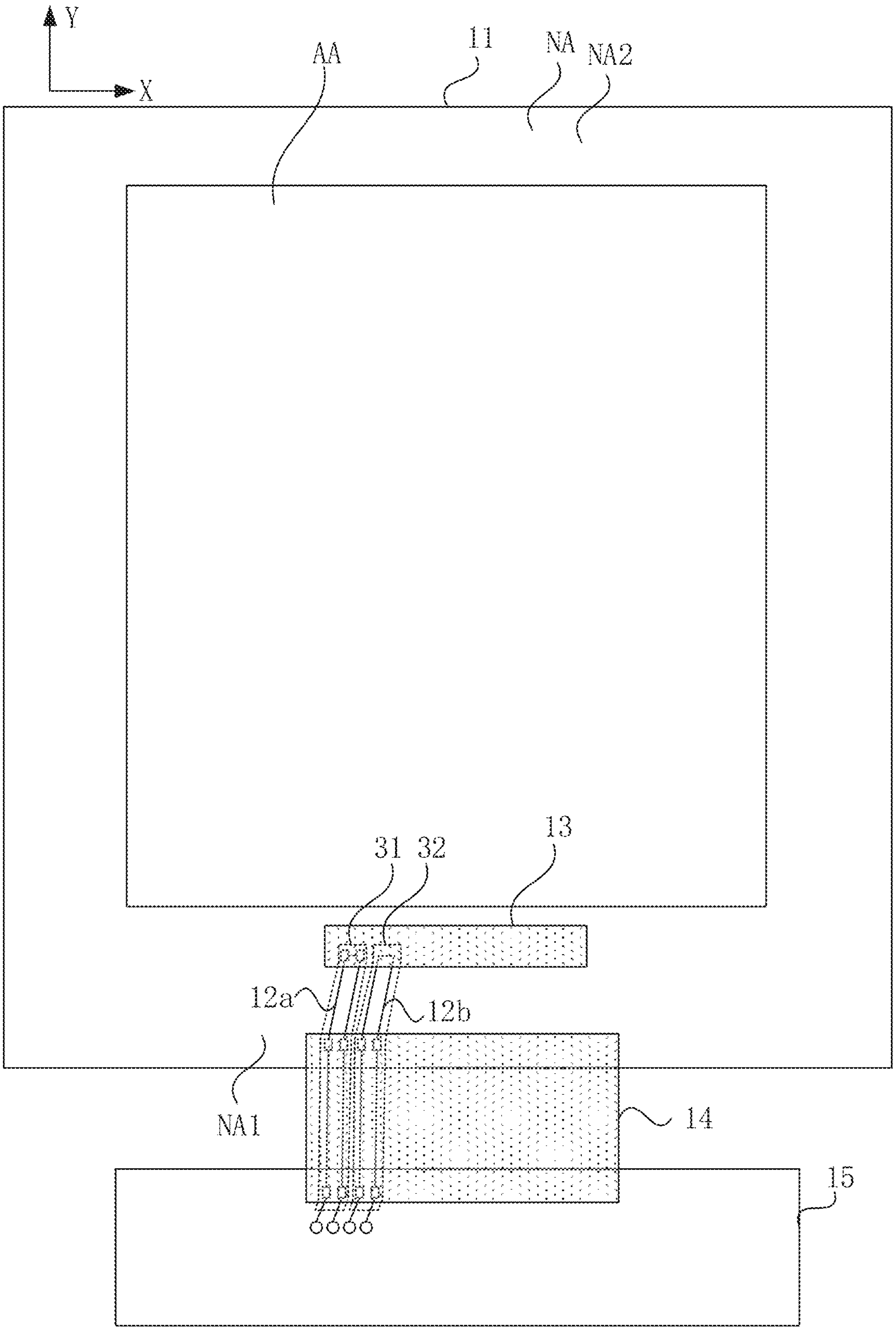
FIG. 2 is a structure diagram of a display device according to an embodiment of the present disclosure.
Figure 3:
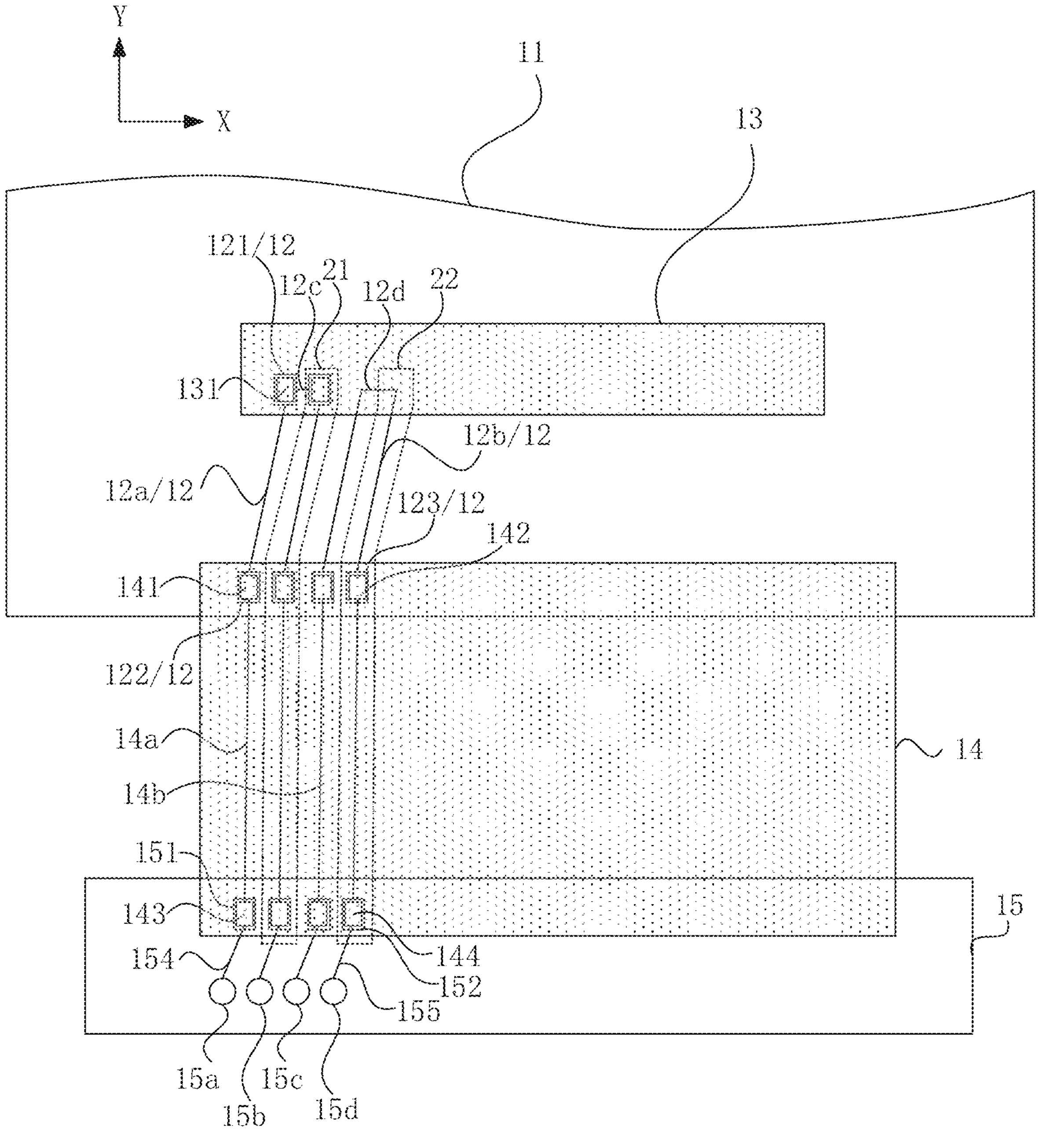
FIG. 3 is a partial structure diagram of a display device according to an embodiment of the present disclosure.

To solve the preceding problems, embodiments of the present disclosure provide a display device. FIG. 2 is a structure diagram of a display device according to an embodiment of the present disclosure. FIG. 3 is a partial structure diagram of a display device according to an embodiment of the present disclosure. As shown in FIGS. 2 and 3, the display device includes a substrate 11 and a metal layer 12 disposed on the substrate, where the metal layer 12 includes a first panel pad 121, a second panel pad 122, and a third panel pad 123.

The display device is bonded to a driver chip 13 and a flexible circuit board 14; a first chip pad 131 of the driver chip 13 is bonded to the first panel pad 121; a first circuit board pad 141 of the flexible circuit board 14 is bonded to the second panel pad 122; a second circuit board pad 142 of the flexible circuit board 14 is bonded to the third panel pad 123; a third circuit board pad 143 of the flexible circuit board 14 is bonded to a first control board pad 151 of a control circuit board 15; and a fourth circuit board pad 144 of the flexible circuit board 14 is bonded to a second control board pad 152 of the control circuit board 15.

The first chip pad 131, the first panel pad 121, a first metal wire 12*a* of the metal layer 12, the second panel pad 122, the first circuit board pad 141, a first internal wire 14*a* of the flexible circuit board 14, the third circuit board pad 143, and the first control board pad 151 are connected in sequence to form a first branch 21; a second metal wire 12*b* of the metal layer 12, the third panel pad 123, the second circuit board pad 142, a second internal wire 14*b* of the flexible circuit board 14, the fourth circuit board pad 144, and the second control board pad 152 are connected in sequence to form a second branch 22; first chip pads 131 of two first branches 21 are electrically connected through a third metal wire 12*c* of the metal layer 12 to form a first test loop 31; and second metal wires 12*b* of two second branches 22 are electrically connected through a fourth metal wire 12*d* of the metal layer 12 to form a second test loop 32; where the length of the first metal wire 12*a* is substantially the same as the length of the second metal wire 12*b*.

The control circuit board 15 includes a first test terminal 15*a*, a second test terminal 15*b*, a third test terminal 15*c*, and a fourth test terminal 15*d*; the first test terminal 15*a* is electrically connected to the first control board pad 151 at a first end of the first test loop 31; the second test terminal 15*b* is electrically connected to the first control board pad 151 at a second end of the first test loop 31; the third test terminal 15*c* is electrically connected to the second control board pad 152 at a first end of the second test loop 32; and the fourth test terminal 15*d* is electrically connected to the second control board pad 152 at a second end of the second test loop 32.

In the embodiments of the present disclosure, a display panel includes the substrate and the metal layer formed on the substrate, and the display device includes the display panel and the driver chip and the flexible circuit board bonded to the display panel. The metal layer forms panel pads, the driver chip includes the first chip pad, and the flexible circuit board includes circuit board pads. The first chip pad, the first panel pad, the first metal wire of the metal layer, the second panel pad, the first circuit board pad, the first internal wire of the flexible circuit board, the third circuit board pad, and the first control board pad are connected in sequence to form the first branch; the second metal wire of the metal layer, the third panel pad, the second circuit board pad, the second internal wire of the flexible circuit board, the fourth circuit board pad, and the second control board pad are connected in sequence to form the second branch; and the two first branches form the first test loop, and the two second branches form the second test loop. In the embodiments of the present disclosure, test terminals may be disposed so that a resistance value of the first test loop and a resistance value of the second test loop are tested, and a bonding resistance value of the first chip pad is acquired according to a difference between the resistance values of the two loops, avoiding a need for pricks with probes to estimate the bonding resistance value of the first chip pad according to a resistance value of the metal wire in the metal layer, omitting actual measurement inconvenient to operate, and avoiding the consumption of a lot of time and energy. Additionally, in the embodiments of the present disclosure, the bonding resistance value of the first chip pad is measured through the first test loop and the second test loop, effectively reducing an error caused by the actual measurement and improving the accuracy of the bonding resistance value of the chip pad.

Technical solutions in the embodiments of the present disclosure are described clearly and completely hereinafter in conjunction with drawings in the embodiments of the present disclosure. Based on the embodiments of the present disclosure, all other embodiments obtained by those of ordinary skill in the art without any creative efforts are within the scope of the present disclosure.

In one or more embodiments, the display device in the embodiments of the present disclosure includes the display panel and the driver chip 13 and the flexible circuit board (for example, an FPC) 14 that are bonded to the display panel. The flexible circuit board 14 may be a good flexible printed circuit board with high reliability and made of a base material such as a polyimide or polyester film. The flexible circuit board has the characteristics of high wiring density, light weight, thin thickness, and good bendability. In the embodiments of the present disclosure, the flexible circuit board 14 may be bent to a back surface of the display panel and bonded to the control circuit board (for example, a PCB) 15 of the display device. The control circuit board 15 may be an aluminum oxide ceramic circuit board or an aluminum nitride ceramic circuit board. The circuit board enables circuits to be mini and visualized and plays an important role in the batch production of fixed circuits and the optimization of electrical device layout. For ease of illustration, FIG. 2 shows that the control circuit board 15 on the back surface of the display panel is extended to be flat with the display panel. In the embodiments of the present disclosure, the display device may be a display device of an electronic device such as a mobile phone, a computer, a television, a notebook, or a wearable device. A specific use of the display device is not particularly limited in the embodiments of the present disclosure. In one or more embodiments, the display device in the embodiments of the present disclosure may be an in-vehicle display device. In the embodiments of the present disclosure, a working process of the display device is as follows: the control circuit board 15 outputs a control signal, a timing signal, and a power signal to the flexible circuit board 14, the flexible circuit board 14 can transmit the above signals to the driver chip 13, and the driver chip 13 generates, according to the above signals, display signals such as a data signal required in a display process of the display panel and transmits the display signals to pixel driving circuits formed in the display panel. The display panel is provided with pixel driving circuits arranged in an array and configured to drive corresponding light-emitting devices to perform image display. In a direction perpendicular to the display panel, the display panel may include the substrate 11 and a driver circuit layer and a light-emitting device layer disposed in sequence on the substrate 11. The driver circuit layer includes insulating layers and metal layers 12 that are alternately arranged to form multiple pixel driving circuits; and light-emitting devices arranged in an array are formed in the light-emitting device layer. That is, the display panel in the embodiments of the present disclosure may be an organic light-emitting diode (OLED) display panel or a micro-light-emitting diode (LED) display panel. Additionally, the display panel in the embodiments of the present disclosure may be a liquid-crystal display (LCD) panel and include an array substrate and a color filter substrate opposite to each other. A specific type of the display panel is not particularly limited in the embodiments of the present disclosure.

Referring to FIG. 3, the driver chip 13 is bonded to the display panel, and a pad is a surface-mounted basic component that can implement a bonding process. The driver chip 13 is provided with chip pads, and the display panel needs to be formed with panel pads bonded to the chip pads. In the embodiments of the present disclosure, the panel pads are disposed in the metal layer 12. The chip pads are electrically connected to the panel pads in a manner such as anisotropic conductive film (ACF) hot-press bonding, soldering, or the like. The pad includes two aspects: a size of the pad and a shape of the pad. In the embodiments of the present disclosure, two pads bonded to each other may have the same shape and similar sizes. As shown in FIG. 3, the first panel pad 121 and the first chip pad 131 may both be rectangular, and the first panel pad 121 may be slightly larger than the first chip pad 131, so as to ensure a bonding effect between the first panel pad 121 and the first chip pad 131. When the alignment accuracy of the driver chip 13 and the first chip pad 131 is not high enough, the slightly larger first panel pad 121 can still ensure a relatively large bonding area between the first panel pad 121 and the first chip pad 131, improving the bonding effect. Similarly, the flexible circuit board 14 is formed with circuit board pads, some of the circuit board pads are bonded to panel pads, and some of the circuit board pads are bonded to control board pads on the control circuit board 15. For example, referring to FIG. 3, the metal layer 12 includes the first panel pad 121, the second panel pad 122, and the third panel pad 123, the flexible circuit board 14 includes the first circuit board pad 141, the second circuit board pad 142, the third circuit board pad 143, and the fourth circuit board pad 144, and the control circuit board 15 includes the first control board pad 151 and the second control board pad 152. The first panel pad 121 is bonded to the first chip pad 131, the first circuit board pad 141 is bonded to the second panel pad 122, the second circuit board pad 142 is bonded to the third panel pad 123, the third circuit board pad 143 is bonded to the first control board pad 151, and the fourth circuit board pad 144 is bonded to the second control board pad 152.

It is to be noted that the bonding resistance value R between the panel pad and the chip pad forms a voltage drop in a signal transmission path, reducing a signal transmission effect and degrading an image display effect of the display panel. Therefore, the measurement of the bonding resistance value R is of great significance for the optimization of IC bonding. However, the bonding resistance value R cannot be measured directly, and when the bonding resistance value R is calculated through the metal wire in the metal layer 12, poor measurement accuracy and a waste of manpower are caused. In the embodiments of the present disclosure, in addition to the signal transmission path formed between the display panel, the driver chip 13, and the flexible circuit board 14, other branches are disposed to form the first test loop 31 and the second test loop 32, the bonding resistance value R between the first panel pad 121 and the first chip pad 131 is provided in the first test loop 31, the bonding resistance value R between the first panel pad 121 and the first chip pad 131 is omitted in the second test loop 32, and a difference between measured resistance values of the two test loops is obtained so that the bonding resistance value R between the first panel pad 121 and the first chip pad 131 can be acquired separately, saving a labor cost and achieving relatively high measurement accuracy since resistance values formed by other components in the test loops tend to be the same.

In one or more embodiments, as shown in FIGS. 2 and 3, the first chip pad 131 of the driver chip 13, the first panel pad 121, the first metal wire 12*a* of the metal layer 12, the second panel pad 122, the first circuit board pad 141, the first internal wire 14*a* of the flexible circuit board 14, the third circuit board pad 143, and the first control board pad 151 are connected in sequence to form the first branch 21. A bonding resistance value R11 is formed between the first chip pad 131 and the first panel pad 121, the first metal wire 12*a* forms a resistance value R12, a bonding resistance value R13 is formed between the second panel pad 122 and the first circuit board pad 141, a resistance value of the first internal wire 14*a* is very small and can be ignored, a bonding resistance value R14 is formed between the third circuit board pad 143 and the first control board pad 151, the two first branches 21 may form the first test loop 31 through the third metal wire 12*c* of the metal layer 12, the third metal wire 12*c* forms a resistance value R15, the control circuit board 15 is provided with the first test terminal 15*a* and the second test terminal 15*b*, the first test terminal 15*a* is connected through a first auxiliary connection line 154 to the first control board pad 151 in one first branch 21 in the first test loop 31, the second test terminal 15*b* is connected through the first auxiliary connection line 154 to the first control board pad 151 in the other first branch 21 in the first test loop 31, and the control circuit board 15 includes copper wires so that resistance values of the first test terminal 15*a*, the second test terminal 15*b*, and the first auxiliary connection line 154 are almost zero and can be ignored. Therefore, a resistance value of the first test loop 31 is (2R11+2R12+2R13+2R14+R15).

The second metal wire 12*b* of the metal layer 12, the third panel pad 123, the second circuit board pad 142, the second internal wire 14*b* of the flexible circuit board 14, the fourth circuit board pad 144, and the second control board pad 152 are connected in sequence to form the second branch 22. A resistance value of the second metal wire 12*b* is R22, a bonding resistance value R23 is formed between the third panel pad 123 and the second circuit board pad 142, a resistance value of the second internal wire 14*b* can be ignored, a bonding resistance value R24 is formed between the fourth circuit board pad 144 and the second control board pad 152, the two second branches 22 may form the second test loop 32 through the fourth metal wire 12*d* of the metal layer 12, the fourth metal wire 12*d* forms a resistance value R25, the control circuit board 15 is provided with the third test terminal 15*c* and the fourth test terminal 15*d*, the third test terminal 15*c* is connected through a second auxiliary connection line 155 to the second control board pad 152 in one second branch 22 in the second test loop 32, the fourth test terminal 15*d* is connected through the second auxiliary connection line 155 to the second control board pad 152 in the other second branch 22 in the second test loop 32, and the control circuit board 15 includes the copper wires so that resistance values of the third test terminal 15*c*, the fourth test terminal 15*d*, and the second auxiliary connection line 155 are almost zero and can be ignored. Therefore, a resistance value of the second test loop 32 is (2R22+2R23+2R24+R25).

In a panel manufacturing technique, the length of the first metal wire 12*a* may be substantially the same as the length of the second metal wire 12*b*. In the embodiments of the present disclosure, "substantially the same" has two meanings: (1) the length of the first metal wire 12*a* may be completely the same as the length of the second metal wire 12*b*, and (2) a difference between the length of the first metal wire 12*a* and the length of the second metal wire 12*b* is less than a set range, where the set range may be set by a user as required. Thus, the resistance value R12 of the first metal wire 12*a* tends to be the same as the resistance value R22 of the second metal wire 12*b* so that a difference between the resistance value of the second test loop 32 and the resistance value of the first test loop 31 does not affect the calculation of the bonding resistance value R11 between the first chip pad 131 and the first panel pad 121. Additionally, in the embodiments of the present disclosure, a pad manufacturing technique is controlled so that the bonding resistance value R13 between the second panel pad 122 and the first circuit board pad 141 can be controlled to be substantially the same as the bonding resistance value R23 between the third panel pad 123 and the second circuit board pad 142, and the bonding resistance value R14 between the third circuit board pad 143 and the first control board pad 151 can be controlled to be substantially the same as the bonding resistance value R24 between the fourth circuit board pad 144 and the second control board pad 152. Then, the bonding resistance value R11 between the first chip pad 131 and the first panel pad 121 is ((2R11+2R12+2R13+2R14+R15)−(2R22+2R23+2R24+R25))/2. That is, since the other components forming the test loops are in one-to-one correspondence and have the same resistance values, the difference between the resistance value of the first test loop 31 and the resistance value of the second test loop 32 is only the bonding resistance value R11 of the first chip pad 131. In the embodiments of the present disclosure, it is unnecessary to acquire the resistance values of the first metal wire 12*a* and the second metal wire 12*b* through manual pricks with probes so that the labor cost can be reduced, and an error caused by manual detection can be avoided, thereby improving the measurement accuracy of R11.

In one or more embodiments, the control circuit board 15 may be further configured to measure a first resistance value R1 between the first test terminal 15*a* and the second test terminal 15*b* and measure a second resistance value R2 between the third test terminal 15*c* and the fourth test terminal 15*d*; and the control circuit board 15 is further configured to acquire the bonding resistance value R11 of the first chip pad 131 according to the first resistance value R1 and the second resistance value R2.

In the embodiments of the present disclosure, the resistance value measured between the first test terminal 15*a* and the second test terminal 15*b* is referred to as the first resistance value R1, and the resistance value measured between the third test terminal 15*c* and the fourth test terminal 15*d* is referred to as the second resistance value R2, where the first resistance value R1 is (2R11+2R12+2R13+2R14+R15), and the second resistance value R2 is (2R22+2R23+2R24+R25). The bonding resistance value R11 of the first chip pad 131 is (R1−R2)/2. In the embodiments of the present disclosure, the first test terminal 15*a*, the second test terminal 15*b*, the third test terminal 15*c*, and the fourth test terminal 15*d* are additionally disposed on the control circuit board 15 so that the resistance values of the two test loops are measured, and the bonding resistance value R11 between the first chip pad 131 and the first panel pad 121 is acquired according to the difference between the measured resistance values of the two test loops, avoiding a need for calculation through the measurement of the first metal wire 12*a* in the test loop through probes, providing a simpler measurement manner convenient to operate, and achieving a relatively small error.

In one or more embodiments, the first metal wire 12*a* and the second metal wire 12*b* may have the same width. Since it is required in the embodiments of the present disclosure that the resistance value R12 of the first metal wire 12*a* be the same as or tend to be consistent with the resistance value R22 of the second metal wire 12*b*, to further ensure that R12 and R22 are the same, it is required in the embodiments of the present disclosure that when the length of the first metal wire 12*a* is substantially the same as the length of the second metal wire 12*b*, the first metal wire 12*a* and the second metal wire 12*b* be configured to have the same width. The metal wires of the metal layer have the same width and length so that the resistance values of the metal wires tend to be consistent. In the embodiments of the present disclosure, when the bonding resistance value R11 of the first chip pad 131 is acquired according to the difference between the first resistance value R1 and the second resistance value R2, since R12 and R22 are completely the same or tend to be consistent, the measurement accuracy of the bonding resistance value R11 of the first chip pad 131 is improved.

In one or more embodiments, the first metal wire 12*a* and the second metal wire 12*b* may be disposed in the same layer. The display panel may include the substrate 11 and the metal layer 12 on the substrate 11. The substrate 11 may be made of a rigid material such as glass or made of a polymer material such as polyimide (PI) or polyethylene terephthalate (PET). Multiple metal layers 12 may be included on the substrate 11, and an insulating layer is disposed between two adjacent metal layers 12. The multiple metal layers 12 may form the driver circuit layer. In a plane parallel to the substrate 11, the driver circuit layer includes the pixel driving circuits arranged in the array. The light-emitting device layer may be further disposed on a side of the driver circuit layer facing away from the substrate 11, and the light-emitting devices correspondingly connected to the pixel driving circuits are disposed in the light-emitting device layer and can emit light of corresponding colors under the control of the pixel driving circuits. In the embodiments of the present disclosure, the first metal wire 12*a* and the second metal wire 12*b* may be formed in the same metal layer 12 so that the first metal wire 12*a* and the second metal wire 12*b* are made of the same material and have the same film thickness, making it convenient to directly control the resistance values through the lengths of the first metal wire 12*a* and the second metal wire 12*b* to make R12 and R22 the same. In one or more embodiments, in the embodiments of the present disclosure, the first metal wire 12*a* and the second metal wire 12*b* disposed in the same layer have the same length and width to further make R12 and R22 the same, improving the measurement accuracy of the bonding resistance value R11 of the first chip pad 131.

Based on the preceding embodiments, in one or more embodiments, a difference between the length of the third metal wire 12*c* and the length of the fourth metal wire 12*d* may be less than or equal to a first set threshold. In addition to the first metal wire 12*a* and the second metal wire 12*b*, the third metal wire 12*c* in the first test loop 31 and the fourth metal wire 12*d* in the second test loop 32 are also metal wires of the metal layer 12, and their resistance values cannot be ignored. In the embodiments of the present disclosure, the resistance value R15 of the third metal wire 12*c* is substantially the same as the resistance value R25 of the fourth metal wire 12*d*. That is, the resistance value R15 of the third metal wire 12*c* is the same as the resistance value R25 of the fourth metal wire 12*d*, or a difference between the resistance value R15 of the third metal wire 12*c* and the resistance value R25 of the fourth metal wire 12*d* is less than a certain set resistance value. In the embodiments of the present disclosure, the third metal wire 12*c* and the fourth metal wire 12*d* may be controlled to be disposed in the same layer, and the difference between the length of the third metal wire 12*c* and the length of the fourth metal wire 12*d* may be less than or equal to the first set threshold to control R15 and R25 to be substantially the same, improving the measurement accuracy of the bonding resistance value R11 of the first chip pad 131. In one or more embodiments, the first set threshold may be 1% of the length of the first metal wire 12*a*; or the first set threshold is 5% of the length of the third metal wire 12*c*. In a process of calculating R11, to improve the calculation accuracy of R11, the difference between the length of the third mental wire 12*c* and the length of the fourth mental wire 12*d* is less than or equal to 1% of the length of the first metal wire 12*a* or 5% of the length of the third metal wire 12*c*. Since the resistance of a metal wire is proportional to the length of a metal wire, the resistance difference between R15 and R25 is less than 1% of the resistance value R12 of the first metal wiring 12*a*, or less than or equal to 5% of the resistance value R15 of the third metal wiring 12*c*, reducing measurement errors of the first resistance value R1 and the second resistance value R2 and further reducing the measurement error of the bonding resistance value R11 of the first chip pad 131.

In one or more embodiments, the length of the third metal wire 12*c* may be the same as the length of the fourth metal wire 12*d*. In the embodiments of the present disclosure, the length of the third metal wire 12*c* and the length of the fourth metal wire 12*d* may be accurately controlled to be the same so that R15 and R25 are completely the same, further improving the measurement accuracy of the bonding resistance value R11 of the first chip pad 131.

In one or more embodiments, the first circuit board pad 141 and the second circuit board pad 142 may have the same size; and the third circuit board pad 143 and the fourth circuit board pad 144 have the same size. The first circuit board pad 141 in the first test loop 31 and the second circuit board pad 142 in the second test loop 32 may have the same shape and area. After the flexible circuit board 14 is successfully aligned with and bonded to the display panel, the bonding resistance value R13 formed between the first circuit board pad 141 and the second panel pad 122 of the display panel is the same as the bonding resistance value R23 formed between the second circuit board pad 142 and the third panel pad 123 of the display panel. In the embodiments of the present disclosure, two adjacent circuit board pads of the flexible circuit board 14 have the same interval, and two adjacent panel pads in the metal layer 12 also have the same interval. After the flexible circuit board 14 is successfully aligned with the display panel, an overlapping area between the first circuit board pad 141 and the second panel pad 122 is the same as an overlapping area between the second circuit board pad 142 and the third panel pad 123 so that the bonding resistance value R13 is the same as the bonding resistance value R23.

Figure 4:
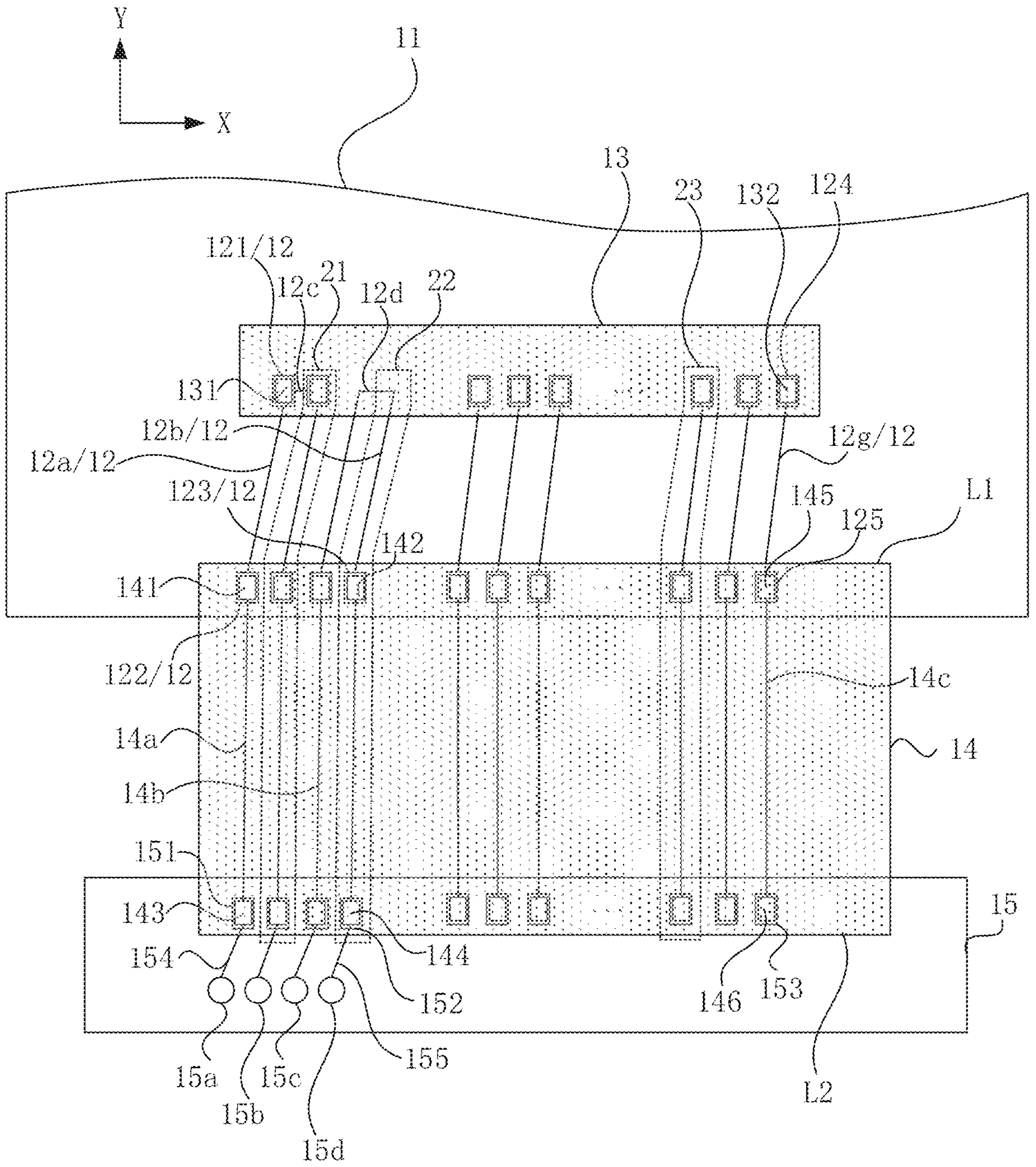
FIG. 4 is another partial structure diagram of a display device according to an embodiment of the present disclosure.

FIG. 4 is another partial structure diagram of a display device according to an embodiment of the present disclosure. In one or more embodiments, the driver chip 13 may further include a second chip pad 132, and the second chip pad 132 of the driver chip 13 is bonded to a fourth panel pad 124 of the metal layer 12; the flexible circuit board 14 further includes a fifth circuit board pad 145 and a sixth circuit board pad 146, the fifth circuit board pad 145 of the flexible circuit board 14 is bonded to a fifth panel pad 125 of the metal layer 12, and the sixth circuit board pad 146 of the flexible circuit board 14 is bonded to a third control board pad 153 of the control circuit board 15; and the second chip pad 132, the fourth panel pad 124, a seventh metal wire 12*g* of the metal layer 12, the fifth panel pad 125, the fifth circuit board pad 145, a third internal wire 14*c* of the flexible circuit board 14, the sixth circuit board pad 146, and the third control board pad 153 are connected in sequence to form a third branch 23, and the third branch 23 is configured to transmit a signal output from the control circuit board 15 to the driver chip 13.

In the display process of the display device, the control circuit board 15 is required to output the control signal to the flexible circuit board 14, the flexible circuit board 14 controls the driver chip 13, and the driver chip 13 sends the signals to the display panel to control the pixel driving circuits of the display panel to implement the image display. In addition to the first branch 21 and the second branch 22, the third branch 23 may be further included. The first branch 21 and the second branch 22 are configured to form the test loops for testing the bonding resistance value R11, and the third branch 23 is configured to transmit the signal output from the control circuit board 15. In one or more embodiments, the third branch 23 includes the second chip pad 132 of the driver chip 13, the fourth panel pad 124 of the display panel, the seventh metal wire 12*g* of the metal layer 12, the fifth panel pad 125 of the display panel, the fifth circuit board pad 145 of the flexible circuit board 14, the third internal wire 14*c* of the flexible circuit board 14, the sixth circuit board pad 146 of the flexible circuit board 14, and the third control board pad 153 of the control circuit board 15, which are connected in sequence. The second chip pad 132 is bonded to the fourth panel pad 124, the fifth panel pad 125 is bonded to the fifth circuit board pad 145, and the sixth circuit board pad 146 is bonded to the third control board pad 153. In one or more embodiments, the first chip pad 131 and the second chip pad 132 have the same size so that a bonding resistance value between the second chip pad 132 and the fourth panel pad 124 is substantially the same as R11; the first circuit board pad 141, the second circuit board pad 142, and the fifth circuit board pad 145 have the same size so that a bonding resistance value between the fifth panel pad 125 and the fifth circuit board pad 145 is substantially the same as R13 or R23; and the third circuit board pad 143, the fourth circuit board pad 144, and the sixth circuit board pad 146 have the same size so that a bonding resistance value between the sixth circuit board pad 146 and the third control board pad 153 is substantially the same as R14 or R24. Additionally, a resistance value of the seventh metal wire 12*g* of the metal layer 12 is substantially the same as the resistance value of the first metal wire 12*a* or the second metal wire 12*b*. Therefore, in the embodiments of the present disclosure, an overall resistance value of the third branch 23 is substantially the same as the overall resistance value of the first branch 21. When the bonding resistance value of the driver chip 13 is measured according to the difference between the resistance value of the first test loop and the resistance value of the second test loop, the measurement accuracy is relatively high and the measurement manner is simple and convenient to operate.

In one or more embodiments, the flexible circuit board 14 may include a first edge L1 and a second edge L2 opposite to each other, the first edge L1 and the second edge L2 extend along a first direction X, and the first direction X is parallel to a plane where the substrate 11 is located; the first circuit board pad 141, the second circuit board pad 142, and multiple fifth circuit board pads 145 are arranged along the first edge L1; and along the first direction X, the first circuit board pad 141 and the second circuit board pad 142 are disposed on at least one side of the multiple fifth circuit board pads 145.

Figure 5:
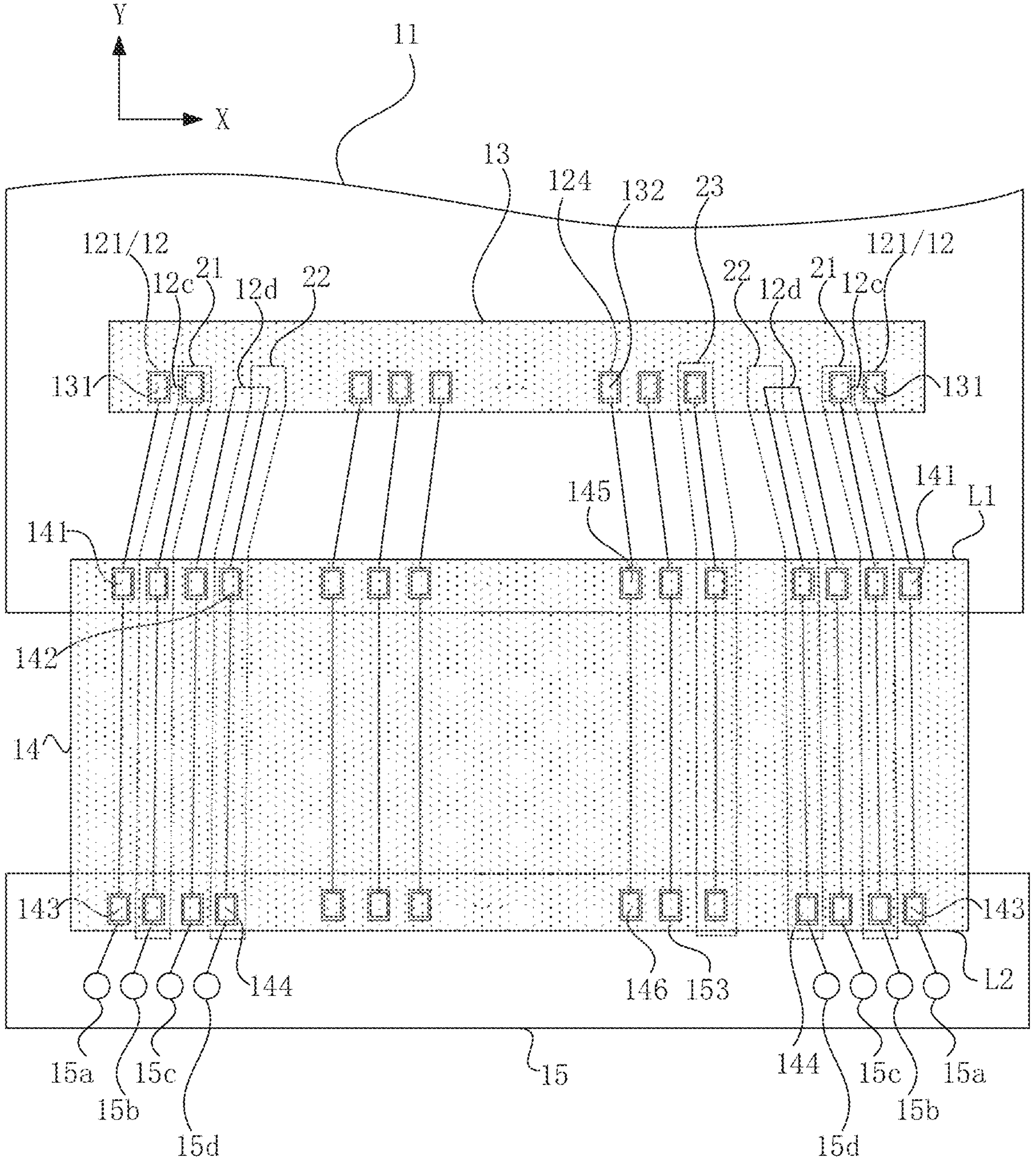
FIG. 5 is another partial structure diagram of a display device according to an embodiment of the present disclosure.

The flexible circuit board 14 includes the first edge L1 close to the display panel and the second edge L2 away from the display panel. The first edge L1 and the second edge L2 may extend along the first direction X, and the first direction X is a direction of a straight line parallel to the plane of the substrate. The first circuit board pad 141, the second circuit board pad 142, and the multiple fifth circuit board pads 145 are arranged along the first edge L1, and the first circuit board pad 141 and the second circuit board pad 142 are disposed on at least one side of the multiple fifth circuit board pads 145. As shown in FIG. 4, the first circuit board pad 141 and the second circuit board pad 142 may be disposed on one side of the fifth circuit board pads 145, and similarly, the third circuit board pad 143 and the fourth circuit board pad 144 may be disposed on one side of the fifth circuit board pads 145 so that the first test loop 31 and the second test loop 32 are disposed on an edge of the flexible circuit board 14 along the first direction X and do not affect a wiring space of the third branch 23. In the embodiments of the present disclosure, corresponding pads and wires are added on edges of the driver chip 13, the display panel, and the flexible circuit board 14, and a simple online test is completed in the manufacturing process to achieve a good wiring scheme and avoid an effect of various different designs of the display panel on the impedance test. Additionally, FIG. 5 is another partial structure diagram of a display device according to an embodiment of the present disclosure. As shown in FIG. 5, the first circuit board pad 141 and the second circuit board pad 142 may be disposed on each of two opposite sides of the fifth circuit board pads 145 along the first direction X. The test loops for testing the bonding resistance value of the driver chip are disposed on each of two opposite edges of the flexible circuit board 14 along the first direction X so that an operator may select the test loops on either side, or to enhance the accuracy of a test result, a test current may be input into all test loops on two opposite sides of the flexible circuit board 14 to acquire two test results, and the two test results are averaged, further improving the measurement accuracy of the bonding resistance value of the driver chip 13 in the embodiments of the present disclosure.

Figure 6:
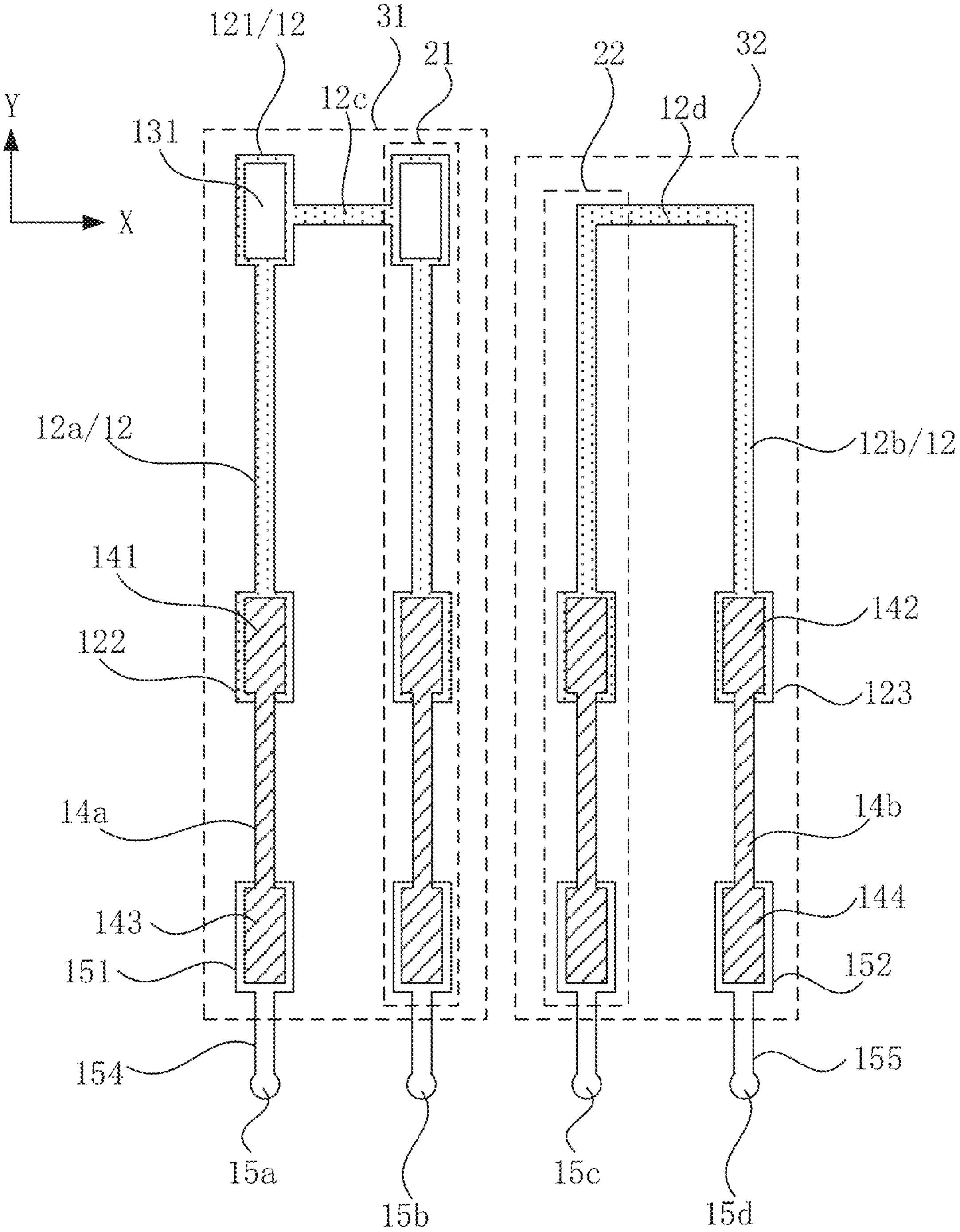
FIG. 6 is a structure diagram of test loops according to an embodiment of the present disclosure.

FIG. 6 is a structure diagram of test loops according to an embodiment of the present disclosure. Still referring to FIGS. 3, 4, and 6, In one or more embodiments, the flexible circuit board 14 may be provided with the first circuit board pad 141, the first circuit board pad 141, the second circuit board pad 142, and the second circuit board pad 142 in sequence along the first direction X; the display device includes the first branch 21, the first branch 21, the second branch 22, and the second branch 22 disposed in sequence along the first direction X; and the two first branches 21 adjacent to each other are connected through the third metal wire 12*c*, the two second branches 22 adjacent to each other are connected through the fourth metal wire 12*d*, and the length of the third metal wire 12*c* is substantially the same as the length of the fourth metal wire 12*d*.

Referring to FIG. 6, the first test loop 31 and the second test loop 32 are disposed in sequence along the first direction X. In one or more embodiments, the following arrangement sequence is formed along the first direction X: the first branch 21, the first branch 21, the second branch 22, and the second branch 22, where the first branch 21 is connected to the adjacent first branch 21 through the third metal wire 12*c* to form the first test loop 31, and the second branch 22 is connected to the adjacent second branch 22 through the fourth metal wire 12*d* to form the second test loop 32. If the length of the third metal wire 12*c* is substantially the same as the length of the fourth metal wire 12*d*, it can be known from FIG. 6 that a difference between the first test loop 31 and the second test loop 32 lies in only the bonding resistance values R11 between two first chip pads 131 and first panel pads 121. In the embodiments of the present disclosure, the first test loop 31 and the second test loop 32 are controlled to form a single variable therebetween so that the variable can be acquired according to the difference between the two test loops, and the operator does not need to measure the metal wire of the display panel through the pricks with probes, improving measurement convenience and the measurement accuracy.

Figure 7:
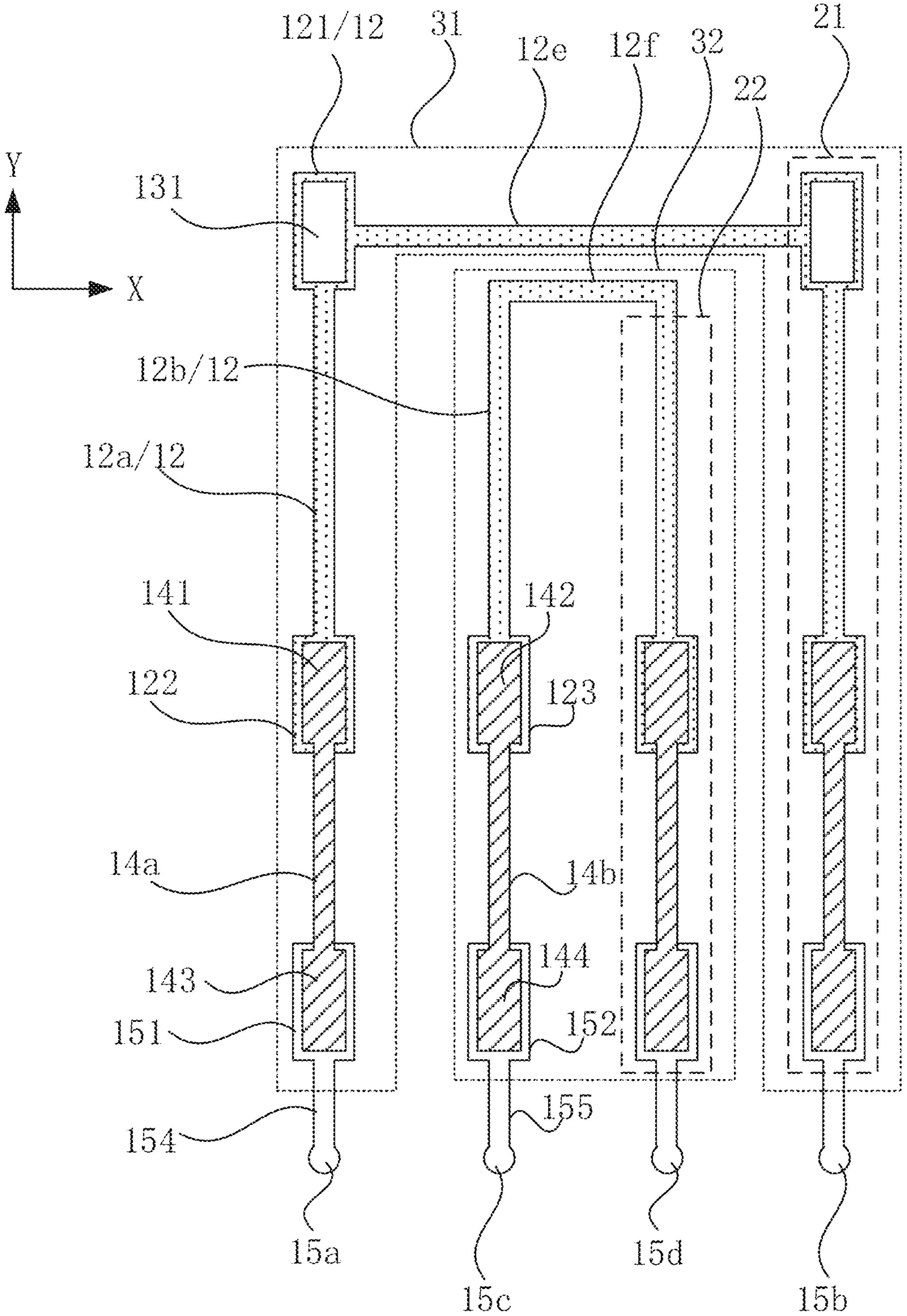
FIG. 7 is another structure diagram of test loops according to an embodiment of the present disclosure.

In addition to the structure shown in FIG. 6, the test loops may be disposed in another form, as shown in FIG. 7. FIG. 7 is another structure diagram of test loops according to an embodiment of the present disclosure. In one or more embodiments, the flexible circuit board 14 may be provided with the first circuit board pad 141, the second circuit board pad 142, the second circuit board pad 142, and the first circuit board pad 141 in sequence along the first direction X; the display device includes the first branch 21, the second branch 22, the second branch 22, and the first branch 21 disposed in sequence along the first direction X; and the two first branches 21 are connected through a fifth metal wire 12*e*, the two second branches 22 are connected through a sixth metal wire 12*f*, and a difference between the length of the fifth metal wire 12*e* and the length of the sixth metal wire 12*f* is relatively small to have a very small effect on the measurement of the resistance value. In the embodiments of the present disclosure, the length of the fifth metal wire 12*e* and the length of the sixth metal wire 12*f* may be considered to be substantially the same.

In the embodiments of the present disclosure, the second test loop 32 may be embedded in the first test loop 31. In one or more embodiments, the following arrangement sequence is formed along the first direction X: the first branch 21, the second branch 22, the second branch 22, and the first branch 21, where the two first branches 21 are connected through the fifth metal wire 12*e* to form the first test loop 31, and the two second branches 22 are connected through the sixth metal wire 12*f* to form the second test loop 32. Similarly, the length of the fifth metal wire 12*e* is substantially the same as the length of the sixth metal wire 12*f*, so as to ensure that the difference between the first test loop 31 and the second test loop 32 lies in only the bonding resistance values R11 between the two first chip pads 131 and first panel pads 121. In the embodiments of the present disclosure, the operator does not need to measure the metal wire of the display panel through probes, improving the measurement convenience of the bonding resistance value R11.

Figure 8:
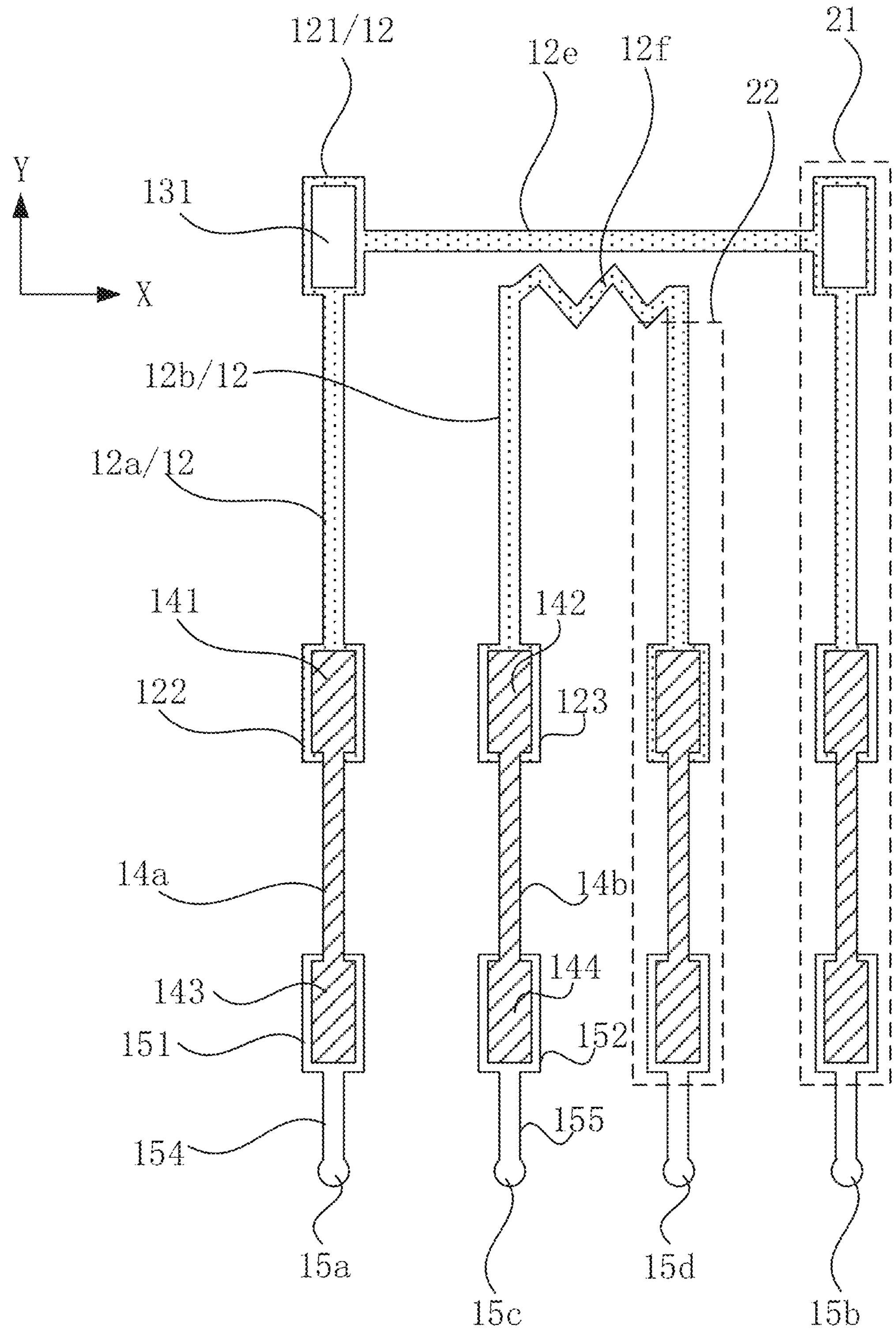
FIG. 8 is another structure diagram of test loops according to an embodiment of the present disclosure.
Figure 9:
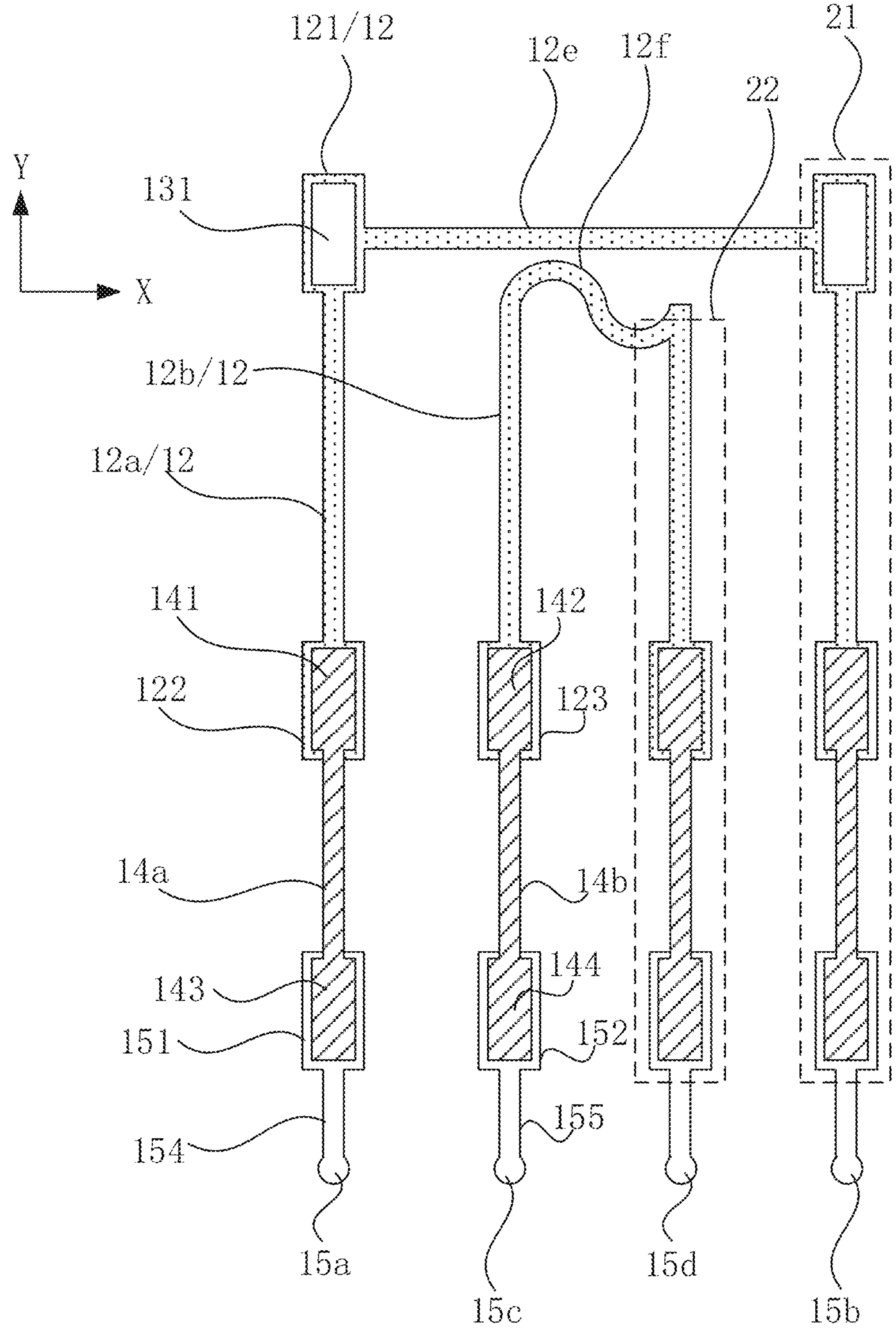
FIG. 9 is another structure diagram of test loops according to an embodiment of the present disclosure.

FIG. 8 is another structure diagram of test loops according to an embodiment of the present disclosure. FIG. 9 is another structure diagram of test loops according to an embodiment of the present disclosure. In one or more embodiments, the sixth metal wire 12*f* extends in a serpentine or zigzag shape along the first direction X. In the embodiments of the present disclosure, since the second test loop 32 is embedded in the first test loop 31, if the sixth metal wire 12*f* and the fifth metal wire 12*e* are linear along the same direction, the following case easily occurs: the length of the sixth metal wire 12*f* is less than the length of the fifth metal wire 12*e*. To ensure that the length of the fifth metal wire 12*e* is substantially the same as the length of the sixth metal wire 12*f*, as shown in FIG. 8, the sixth metal wire 12*f* may be in the zigzag shape. Although the sixth metal wire 12*f* and the fifth metal wire 12*e* both extend along the first direction X, the substantial length of the sixth metal wire 12*f* in the zigzag shape can be effectively increased so that the substantial length of the sixth metal wire 12*f* is equal to that of the fifth metal wire 12*e*. As shown in FIG. 9, the sixth metal wire 12*f* may be in the serpentine shape to increase the substantial length of the sixth metal wire 12*f* so that the substantial length of the sixth metal wire 12*f* is equal to that of the fifth metal wire 12*e*, thereby ensuring that the difference between the first test loop 31 and the second test loop 32 lies in only the bonding resistance values R11 between the two first chip pads 131 and first panel pads 121 and improving the measurement accuracy of the bonding resistance value R11.

Still referring to FIG. 2, In one or more embodiments, the display device may include a display region AA and a non-display region NA at least partially surrounding the display region AA, the non-display region NA includes a first non-display region NA1 and a second non-display region NA2 opposite to each other along a second direction Y, and the second direction Y is parallel to the plane where the substrate 11 is located; the first non-display region NA1 is bonded to the driver chip 13 and the flexible circuit board 14, and the flexible circuit board 14 is disposed on a side of the driver chip 13 facing away from the display region; and the driver chip 13 is a source driving chip, and the first metal wire 12*a* and the second metal wire 12*b* are linear.

The display panel includes the display region AA and the non-display region NA surrounding the display region AA. The non-display region NA in the embodiments of the present disclosure may include the first non-display region NA1 and the second non-display region NA2 opposite to each other along the second direction Y, where the second direction Y is parallel to the plane where the substrate 11 is located, and the second direction Y intersects the first direction X. In one or more embodiments, the first direction X and the second direction Y may be perpendicular to each other. The first non-display region NA1 is bonded to the driver chip 13 and the flexible circuit board 14. In the embodiments of the present disclosure, the driver chip 13 is the source driving chip and configured to receive control signals input from the flexible circuit board 14 and generate signals for driving the display panel. In the embodiments of the present disclosure, the first metal wire 12*a* and the second metal wire 12*b* between the driver chip 13 and the flexible circuit board 14 are linear. In the embodiments of the present disclosure, the test loops are disposed on the source driving chip so that the bonding resistance value of the source driving chip is accurately acquired. In one or more embodiments, the first metal wire 12*a* and the second metal wire 12*b* may be disposed in parallel so that the first metal wire 12*a* and the second metal wire 12*b* have the same length and are located in the same environment, thereby reducing a difference between the resistance values of the first metal wire 12*a* and the second metal wire 12*b* in the display panel.

Figure 10:
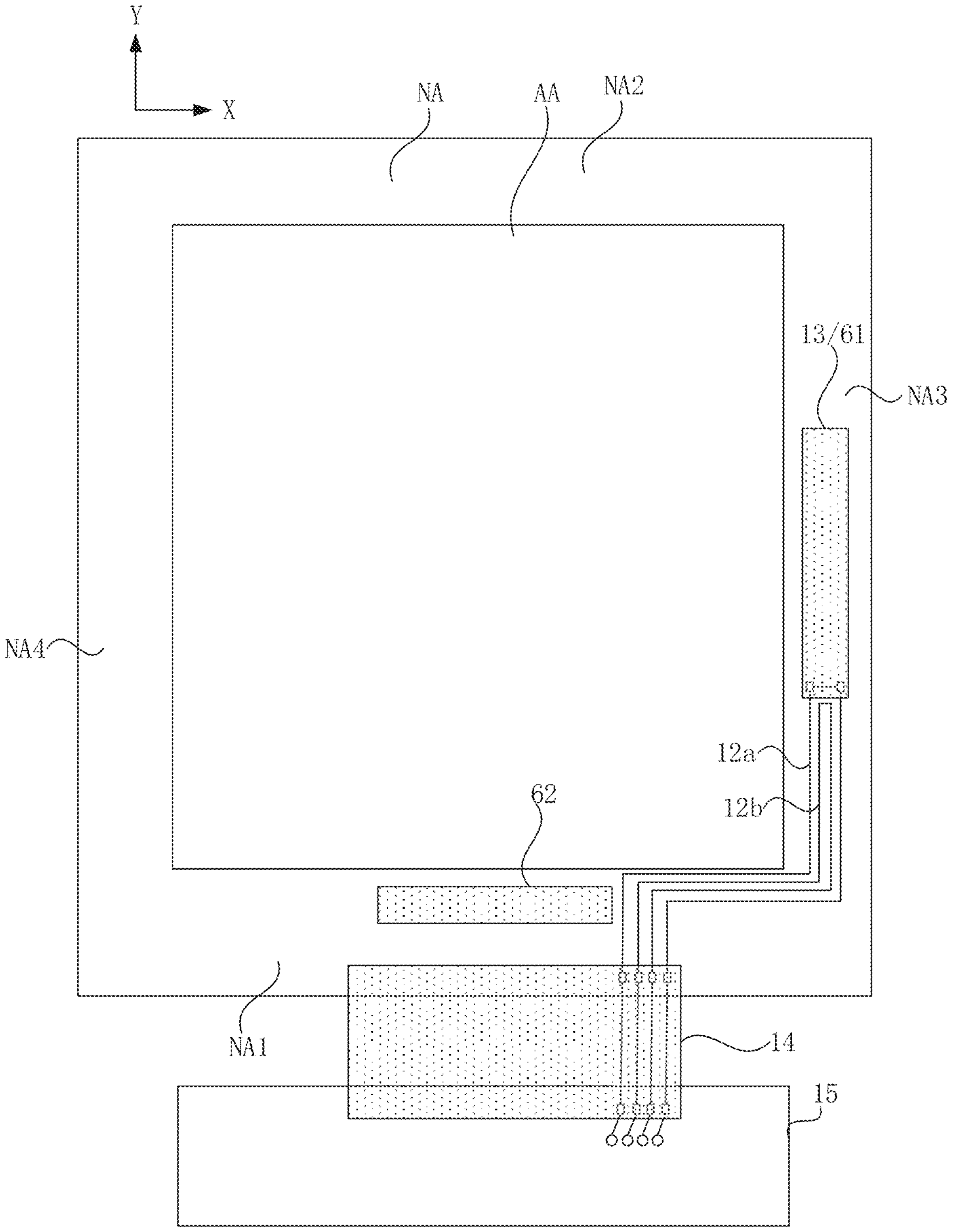
FIG. 10 is another partial structure diagram of a display device according to an embodiment of the present disclosure.

FIG. 10 is another partial structure diagram of a display device according to an embodiment of the present disclosure. In one or more embodiments, the display device may include the display region AA and the non-display region NA at least partially surrounding the display region; the non-display region NA includes the first non-display region NA1 and the second non-display region NA2 opposite to each other along the second direction Y and a third non-display region NA3 and a fourth non-display region NA4 opposite to each other along the first direction X; and the first direction X intersects the second direction Y; the third non-display region NA3 is bonded to the driver chip 13, and the first non-display region NA1 is bonded to the flexible circuit board 14; and the driver chip 13 is a gate driving chip, and the first metal wire 12*a* and the second metal wire 12*b* extend in a zigzag shape along the display region AA.

Figure 11:
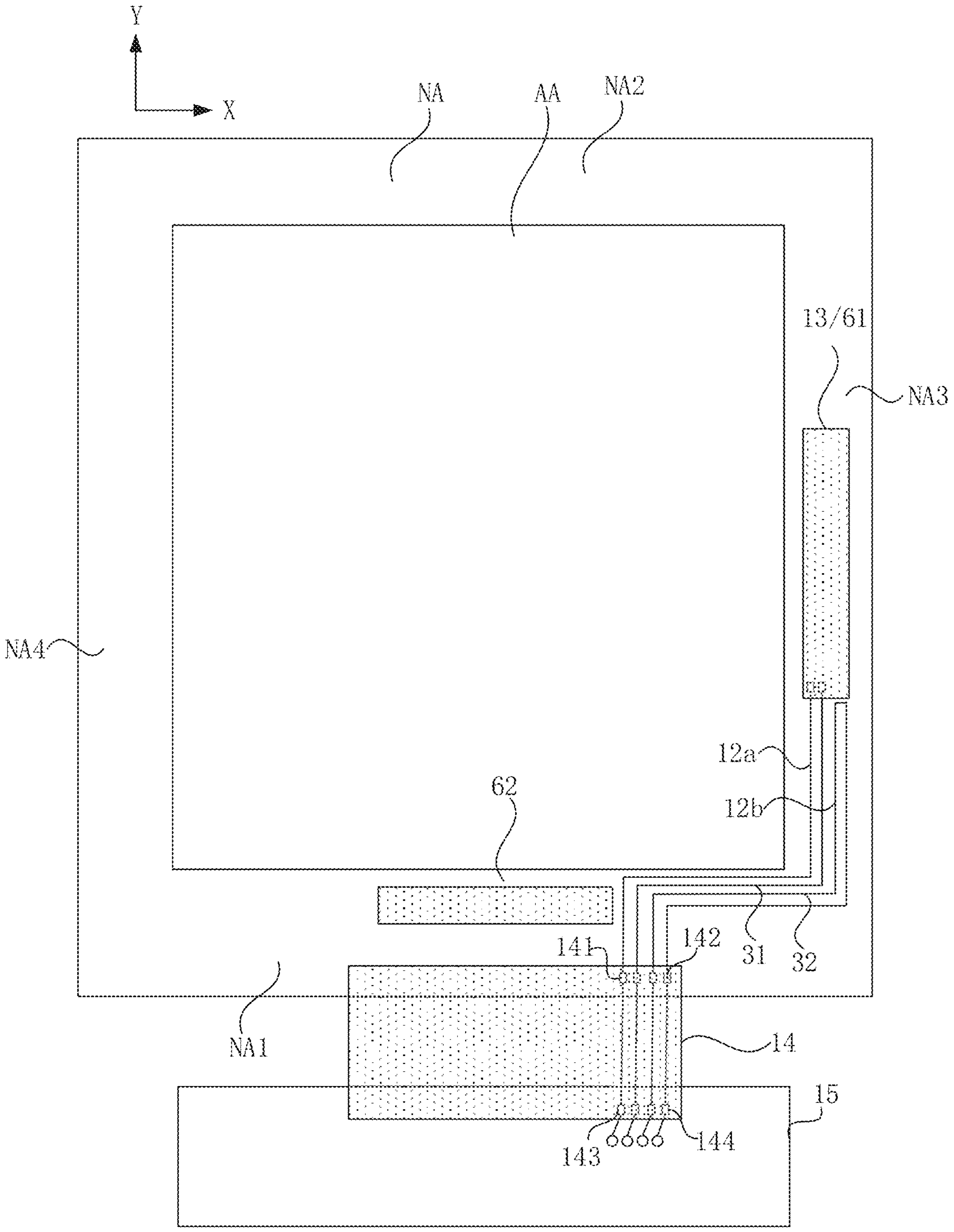
FIG. 11 is another partial structure diagram of a display device according to an embodiment of the present disclosure.

In the embodiments of the present disclosure, in addition to the first non-display region NA1 and the second non-display region NA2 opposite to each other along the second direction Y, the non-display region NA of the display panel includes the third non-display region NA3 and the fourth non-display region NA4 opposite to each other along the first direction X. The first non-display region NA1 is adjacent to the third non-display region NA3, the third non-display region NA3 is bonded to the driver chip 13 (a gate driving chip 61), the first non-display region NA1 is bonded to a source driving chip 62 and the flexible circuit board 14, and the first test loop and the second test loop disposed for the driver chip 13 and the flexible circuit board 14 are required to be provided with a relatively long first metal wire 12*a* and a relatively long second metal wire 12*b*, respectively. The first metal wire 12*a* and the second metal wire 12*b* may extend in the zigzag shape along edges of the display region AA. In the embodiments of the present disclosure, the test loops are disposed on the gate driving chip 61 so that the bonding resistance value of the source driving chip 62 is accurately acquired. In one or more embodiments, polyline segments of the first metal wire 12*a* and the second metal wire 12*b* may be disposed in parallel so that the first metal wire 12*a* and the second metal wire 12*b* have the same length and are located in the same environments, thereby reducing the difference between the resistance values of the first metal wire 12*a* and the second metal wire 12*b* in the display panel. FIG. 10 shows a wiring manner in which the second test loop is embedded in the first test loop, where specific wiring of the first test loop and the second test loop may be the structures shown in FIGS. 7 to 9. Of course, the test loops on the gate driving chip 61 may be those shown in FIG. 6. A specific arrangement manner of the first test loop and the second test loop is not particularly limited in the embodiments of the present disclosure. As shown in FIG. 11 which is another partial structure diagram of a display device according to an embodiment of the present disclosure, the first test loop 31 and the second test loop 32 are disposed side by side. Referring to FIGS. 10 and 11, in the embodiments of the present disclosure, the first metal wire 12*a* and the second metal wire 12*b* in the zigzag shape may be disposed in the same metal layer to ensure that the first metal wire 12*a* and the second metal wire 12*b* have the same resistance value.

Still referring to FIG. 11, In one or more embodiments, along the first direction X, the second circuit board pad 142 is disposed on a side of the first circuit board pad 141 facing away from the display region AA; and along the first direction X, the fourth circuit board pad 144 is disposed on a side of the third circuit board pad 143 facing an edge of the flexible circuit board 14. Therefore, in the embodiments of the present disclosure, the second test loop 32 is disposed on a side of the first test loop 31 facing away from the center of the display panel. In one or more embodiments, the second circuit board pad 142 is disposed on a side of the first circuit board pad 141 facing away from a central region, and the fourth circuit board pad 144 is disposed on a side of the third circuit board pad 143 facing away from the central region, that is, the second test loop 32 is disposed closer to edges of the display panel than the first test loop 31. Relative to the test loop in the related art, in the embodiments of the present disclosure, only one second test loop is added on an edge of the flexible circuit board 14 along the first direction X, and the second test loop is disposed only in an edge region and is not laid together with other third branches, facilitating the layout of test terminals and making it convenient and quick to measure the bonding resistance value of the driver chip 13. It is to be noted that not only the second test loop but also the first test loop may be at a certain distance from the third branches for transmitting signals, making it convenient for the operator to distinguish the positions of the test loops in time and improving the measurement efficiency.

Figure 12:
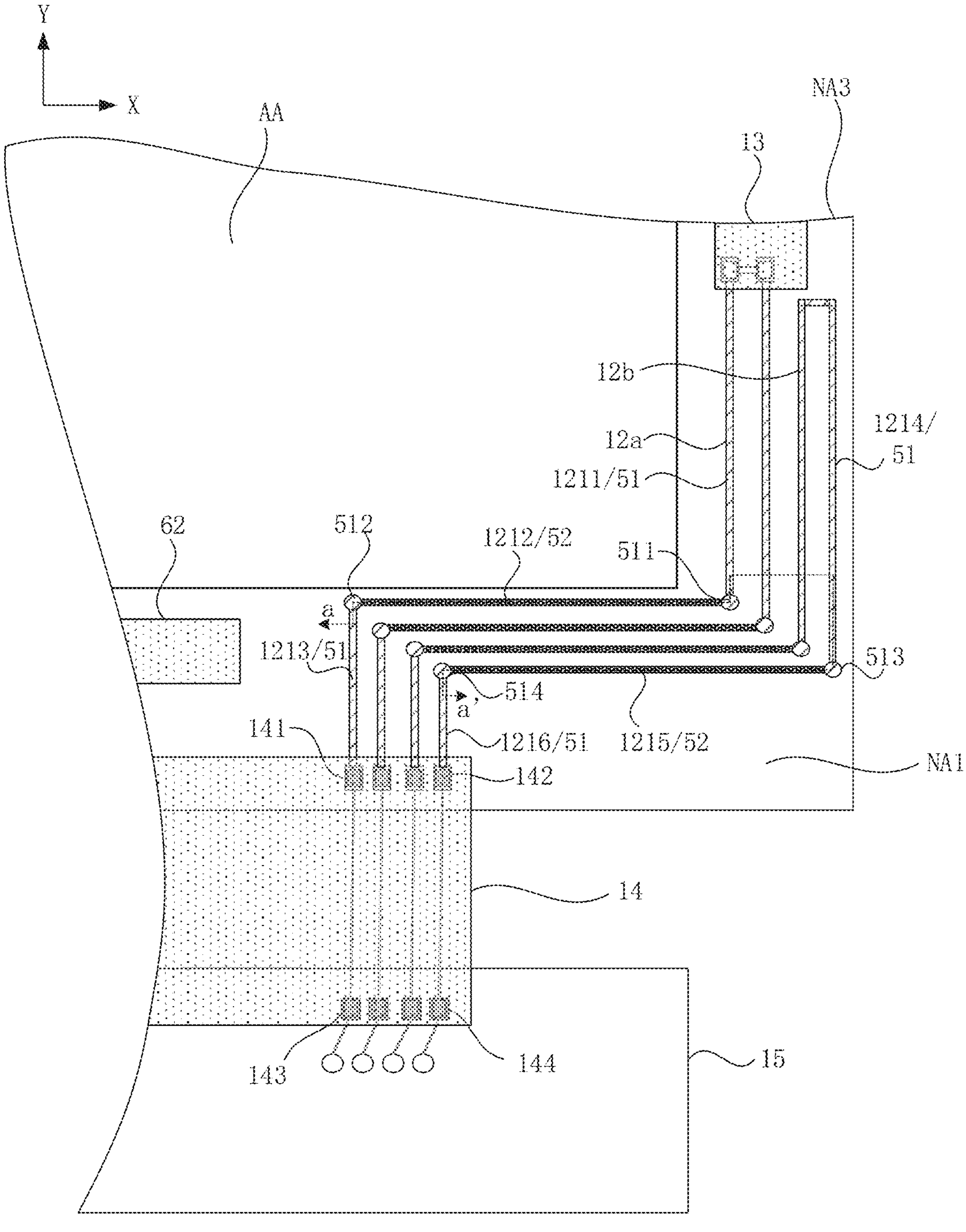
FIG. 12 is another partial structure diagram of a display device according to an embodiment of the present disclosure.
Figure 13:
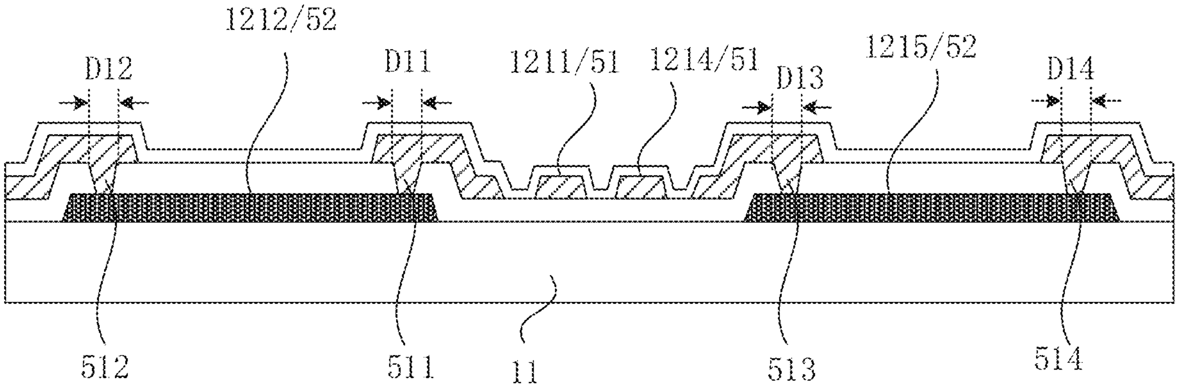
FIG. 13 is a sectional view of FIG. 12 along a line a-a'.

FIG. 12 is another partial structure diagram of a display device according to an embodiment of the present disclosure. FIG. 13 is a sectional view of FIG. 12 along a line a-a'. In one or more embodiments, the metal layer 12 may include at least a first metal layer 51 and a second metal layer 52; the first metal wire 12*a* sequentially includes a first sub-metal wire 1211 extending along the second direction Y, a second sub-metal wire 1212 extending along the first direction X, and a third sub-metal wire 1213 extending along the second direction Y; the second metal wire 12*b* sequentially includes a fourth sub-metal wire 1214 extending along the second direction Y, a fifth sub-metal wire 1215 extending along the first direction X, and a sixth sub-metal wire 1216 extending along the second direction Y; the first sub-metal wire 1211, the third sub-metal wire 1213, the fourth sub-metal wire 1214, and the sixth sub-metal wire 1216 are located in the first metal layer 51, and the second sub-metal wire 1212 and the fifth sub-metal wire 1215 are located in the second metal layer 52; and the first sub-metal wire 1211 is electrically connected to the second sub-metal wire 1212 through a first via 511, the third sub-metal wire 1213 is electrically connected to the second sub-metal wire 1212 through a second via 512, the fourth sub-metal wire 1214 is electrically connected to the fifth sub-metal wire 1215 through a third via 513, and the fifth sub-metal wire 1215 is electrically connected to the sixth sub-metal wire 1216 through a fourth via 514.

In the embodiments of the present disclosure, the driver circuit layer includes the multiple metal layers. When the first metal wire 12*a* and the second metal wire 12*b* are relatively long in length, as shown in FIG. 12, the metal wires in the zigzag shape occupy a relatively large space of the non-display region. In the embodiments of the present disclosure, the first metal wire 12*a* and the second metal wire 12*b* may be divided into multiple segments, and different segments may be disposed in different metal layers so that the first metal wire 12*a* and the second metal wire 12*b* occupy a relatively small space of a certain metal layer, facilitating the layout of other devices or facilitating a decrease in the width of the non-display region and achieving a narrow bezel design of the display panel. In one or more embodiments, in the embodiments of the present disclosure, the first metal wire 12*a* and the second metal wire 12*b* may be disposed in the first metal layer 51 and the second metal layer 52. The first metal wire 12*a* may be sequentially divided into the first sub-metal wire 1211 extending along the second direction Y, the second sub-metal wire 1212 extending along the first direction X, and the third sub-metal wire 1213 extending along the second direction Y; and the second metal wire 12*b* may be sequentially divided into the fourth sub-metal wire 1214 extending along the second direction Y, the fifth sub-metal wire 1215 extending along the first direction X, and the sixth sub-metal wire 1216 extending along the second direction Y. The second sub-metal wire 1212 and the fifth sub-metal wire 1215 are located in the second metal layer 52 so that from the perspective of the first metal layer 51, a space of the first non-display region NA1 is saved and the width of a lower bezel of the display panel is reduced. Moreover, the first metal layer 51 and the second metal layer 52 are connected through vias so that the first sub-metal wire 1211, the first via 511, the second sub-metal wire 1212, the second via 512, and the third sub-metal wire 1213 are electrically connected in sequence to form the first metal wire 12*a*. Similarly, the fourth sub-metal wire 1214, the third via 513, the fifth sub-metal wire 1215, the fourth via 513, and the sixth sub-metal wire 1216 are electrically connected in sequence to form the second metal wire 12*b*. In the embodiments of the present disclosure, on the basis of ensuring a simple line arrangement and a relatively small occupied space, the corresponding test loops are disposed on the gate driving chip 61, thereby improving the measurement quickness of the bonding resistance value of the gate driving chip 61.

In the embodiments of the present disclosure, the first sub-metal wire 1211 and the fourth sub-metal wire 1214 are located in the same metal layer and are the same in material and thickness, making it convenient to control the first sub-metal wire 1211 and the fourth sub-metal wire 1214 to have the same resistance value; the second sub-metal wire 1212 and the fifth sub-metal wire 1215 are both located in the second metal layer 52 and are the same in material and thickness, making it convenient to control the second sub-metal wire 1212 and the fifth sub-metal wire 1215 to have the same resistance value; and similarly, the third sub-metal wire 1213 and the sixth sub-metal wire 1216 are disposed in the same layer to facilitate the same resistance value. In one or more embodiments, the first sub-metal wire 1211 and the fourth sub-metal wire 1214 may have the same wire width; the second sub-metal wire 1212 and the fifth sub-metal wire 1215 have the same wire width; and the third sub-metal wire 1213 and the sixth sub-metal wire 1216 have the same wire width. For example, if the first sub-metal wire 1211 and the fourth sub-metal wire 1214 are the same in the wire width, material, and film thickness, in the embodiments of the present disclosure, the first sub-metal wire 1211 and the fourth sub-metal wire 1214 may be controlled to have the same length to achieve the same resistance value of the first sub-metal wire 1211 and the fourth sub-metal wire 1214. Similarly, the second sub-metal wire 1212 and the fifth sub-metal wire 1215 have the same wire width, and the third sub-metal wire 1213 and the sixth sub-metal wire 1216 have the same wire width. In the embodiments of the present disclosure, although the first metal wire 12*a* and the second metal wire 12*b* are disposed in two metal layers, the sub-metal wires of the first metal wire 12*a* and the second metal wire 12*b* are disposed in one-to-one correspondence to ensure that the corresponding sub-metal wires have the same impedance so that when the bonding resistance value of the gate driving chip is tested through the test loops, the single variable can be effectively controlled, improving the measurement accuracy of the bonding resistance value.

Still referring to FIG. 13, In one or more embodiments, the first via 511 and the third via 513 may have the same aperture, and the second via 512 and the fourth via 514 have the same aperture. The aperture D11 of the first via 511 is the same as or substantially the same as the aperture D13 of the third via 513, and the aperture D12 of the second via 512 is the same as or substantially the same as the aperture D14 of the fourth via 514, so as to further ensure that the first metal wire 12*a* and the second metal wire 12*b* have the same resistance value, improving the measurement accuracy of the bonding resistance value of the gate driving chip.

To conclude, a design for detection of the IC bonding resistance value of the display device may be optimized in the embodiments of the present disclosure so that the actual bonding resistance value of a source IC (the source driving chip) or a gate IC (the gate driving chip) can be directly calculated according to the actually measured values, achieving a convenient and quick detection manner. Moreover, the occupation of the wiring space can be avoided as much as possible through vias or in a manner of wire wrapping, achieving the narrow bezel design of the display panel and improving user experience.

Figure 14:
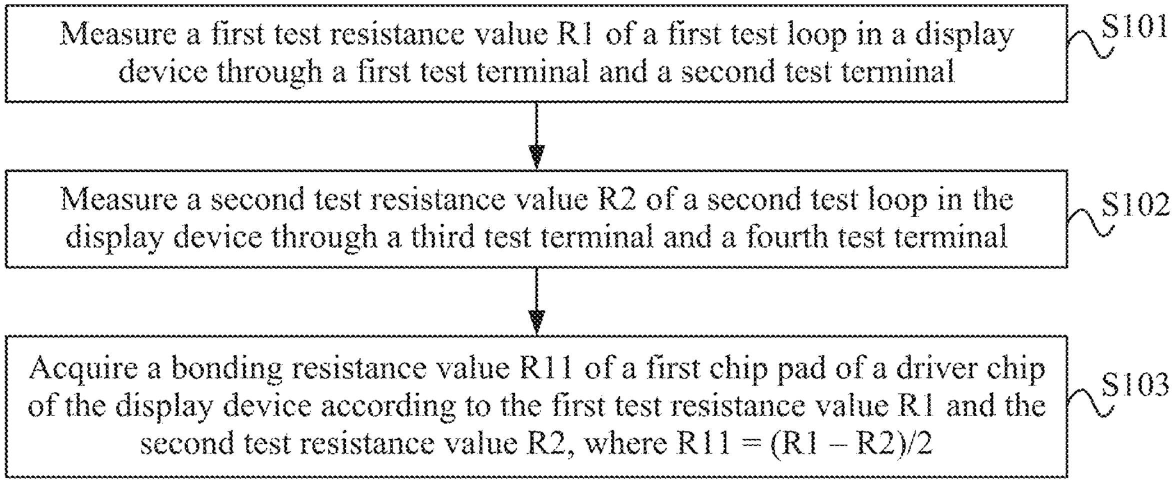
FIG. 14 is a flowchart of a test method for a display device according to an embodiment of the present disclosure.

Based on the same concept, embodiments of the present disclosure further provide a test method for a display device. FIG. 14 is a flowchart of a test method for a display device according to an embodiment of the present disclosure. As shown in FIG. 14, the method of the embodiments of the present disclosure includes the steps below.

In step S101, a first resistance value R1 of a first test loop in the display device is measured through a first test terminal and a second test terminal.

In step S102, a second resistance value R2 of a second test loop in the display device is measured through a third test terminal and a fourth test terminal.

In step S103, a bonding resistance value R11 of a first chip pad of a driver chip of the display device is acquired according to the first resistance value R1 and the second resistance value R2, where R11=(R1−R2)/2.

In the embodiments of the present disclosure, a display panel includes a substrate and a metal layer formed on the substrate, and the display device includes the display panel and the driver chip and a flexible circuit board bonded to the display panel. The metal layer forms panel pads, the driver chip includes the first chip pad, and the flexible circuit board includes circuit board pads. The first chip pad, a first panel pad, a first metal wire of the metal layer, a second panel pad, a first circuit board pad, a first internal wire of the flexible circuit board, a third circuit board pad, and a first control board pad are connected in sequence to form a first branch; a second metal wire of the metal layer, a third panel pad, a second circuit board pad, a second internal wire of the flexible circuit board, a fourth circuit board pad, and a second control board pad are connected in sequence to form a second branch; and two first branches form the first test loop, and two second branches form the second test loop. In the embodiments of the present disclosure, test terminals may be disposed so that the resistance value of the first test loop and the resistance value of the second test loop are tested, and the bonding resistance value of the first chip pad is acquired according to a difference between the resistance values of the two loops, avoiding a need for pricks with probes to estimate the bonding resistance value of the first chip pad according to a resistance value of the metal wire in the metal layer, omitting actual measurement inconvenient to operate, and avoiding the consumption of a lot of time and energy. Additionally, in the embodiments of the present disclosure, the bonding resistance value of the first chip pad is measured through the first test loop and the second test loop, effectively reducing an error caused by the actual measurement and improving the accuracy of the bonding resistance value of the chip pad.

Based on the preceding embodiment, that the first resistance value R1 of the first test loop in the display device is measured through the first test terminal and the second test terminal may include connecting a multimeter to the first test terminal and the second test terminal separately to acquire the first resistance value R1; and that the second resistance value R2 of the second test loop in the display device is measured through the third test terminal and the fourth test terminal includes connecting the multimeter to the third test terminal and the fourth test terminal separately to acquire the second resistance value R2. In the embodiments of the present disclosure, only the first test terminal, the second test terminal, the third test terminal, and the fourth test terminal are pricked through the multimeter so that the bonding resistance value of the chip pad can be directly acquired, avoiding a need to separately measure the metal wire in the display panel, saving a labor cost, improving the measurement convenience, preventing an error caused by the measurement of the metal wire by an operator through pricks with probes, and improving the measurement accuracy.

It is to be noted that the preceding are preferred embodiments of the present disclosure and technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, although the present disclosure has been described in detail through the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A display device, comprising: a substrate and a metal layer disposed on the substrate, wherein the metal layer comprises a first panel pad, a second panel pad, and a third panel pad;

wherein the display device is bonded to a driver chip and a flexible circuit board, a first chip pad of the driver chip is bonded to the first panel pad, a first circuit board pad of the flexible circuit board is bonded to the second panel pad, a second circuit board pad of the flexible circuit board is bonded to the third panel pad, a third circuit board pad of the flexible circuit board is bonded to a first control board pad of a control circuit board, and a fourth circuit board pad of the flexible circuit board is bonded to a second control board pad of the control circuit board;

wherein the first chip pad, the first panel pad, a first metal wire of the metal layer, the second panel pad, the first circuit board pad, a first internal wire of the flexible circuit board, the third circuit board pad, and the first control board pad are connected in sequence to form a first branch, a second metal wire of the metal layer, the third panel pad, the second circuit board pad, a second internal wire of the flexible circuit board, the fourth circuit board pad, and the second control board pad are connected in sequence to form a second branch, first chip pads of two first branches are electrically connected through a third metal wire of the metal layer to form a first test loop, second metal wires of two second branches are electrically connected through a fourth metal wire of the metal layer to form a second test loop, and a length of the first metal wire is same as a length of the second metal wire; and wherein the control circuit board comprises a first test terminal, a second test terminal, a third test terminal, and a fourth test terminal; the first test terminal is electrically connected to the first control board pad at a first end of the first test loop; the second test terminal is electrically connected to the first control board pad at a second end of the first test loop; the third test terminal is electrically connected to the second control board pad at a first end of the second test loop; and the fourth test terminal is electrically connected to the second control board pad at a second end of the second test loop.

2. The display device according to claim 1, wherein a first resistance value between the first test terminal and the second test terminal is R1, and a second resistance value between the third test terminal and the fourth test terminal is R2; and a bonding resistance value of the first chip pad is R, wherein R=(R1−R2)/2 first resistance value resistance value.

3. The display device according to claim 1, wherein the first metal wire and the second metal wire have a same width.

4. The display device according to claim 1, wherein the first metal wire and the second metal wire are disposed in a same layer.

5. The display device according to claim 1, wherein a difference between a length of the third metal wire and a length of the fourth metal wire is less than or equal to a first set threshold.

6. The display device according to claim 5, wherein the length of the third metal wire is the same as the length of the fourth metal wire; or, wherein the first set threshold is 1% of the length of the first metal wire or 5% of the length of the third metal wire.

7. The display device according to claim 1, wherein the first circuit board pad and the second circuit board pad have a same size; and the third circuit board pad and the fourth circuit board pad have a same size.

8. The display device according to claim 1, wherein the driver chip further comprises a second chip pad, and the second chip pad of the driver chip is bonded to a fourth panel pad of the metal layer;

the flexible circuit board further comprises a fifth circuit board pad and a sixth circuit board pad, the fifth circuit board pad of the flexible circuit board is bonded to a fifth panel pad of the metal layer, and the sixth circuit board pad of the flexible circuit board is bonded to a third control board pad of the control circuit board; and the second chip pad, the fourth panel pad, a seventh metal wire of the metal layer, the fifth panel pad, the fifth circuit board pad, a third internal wire of the flexible circuit board, the sixth circuit board pad, and the third control board pad are connected in sequence to form a third branch.

9. The display device according to claim 8, wherein the first chip pad and the second chip pad have a same size; the first circuit board pad, the second circuit board pad, and the fifth circuit board pad have a same size; and the third circuit board pad, the fourth circuit board pad, and the sixth circuit board pad have a same size.

10. The display device according to claim 8, wherein the flexible circuit board comprises a first edge and a second edge opposite to each other, the first edge and the second edge extend along a first direction, and the first direction is parallel to a plane where the substrate is located; and the first circuit board pad, the second circuit board pad, and a plurality of fifth circuit board pads are arranged along the first edge; and along the first direction, the first circuit board pad and the second circuit board pad are disposed on at least one side of the plurality of fifth circuit board pads.

11. The display device according to claim 10, wherein the flexible circuit board is provided with the first circuit board pad, the first circuit board pad, the second circuit board pad, and the second circuit board pad in sequence along the first direction; and the display device comprises the first branch, the first branch, the second branch, and the second branch disposed in sequence along the first direction; and two first branches adjacent to each other are connected through the third metal wire, two second branches adjacent to each other are connected through the fourth metal wire, and a length of the third metal wire is same as a length of the fourth metal wire.

12. The display device according to claim 10, wherein the flexible circuit board is provided with the first circuit board pad, the second circuit board pad, the second circuit board pad, and the first circuit board pad in sequence along the first direction; and the display device comprises the first branch, the second branch, the second branch, and the first branch disposed in sequence along the first direction; and the two first branches are connected through a fifth metal wire, the two second branches are connected through a sixth metal wire, and a length of the fifth metal wire is same as a length of the sixth metal wire.

13. The display device according to claim 12, wherein the sixth metal wire extends in a serpentine or zigzag shape along the first direction.

14. The display device according to claim 1, comprising a display region and a non-display region at least partially surrounding the display region, wherein the non-display region comprises a first non-display region and a second non-display region opposite to each other along a second direction, and the second direction is parallel to a plane where the substrate is located;

the first non-display region is bonded to the driver chip and the flexible circuit board, and the flexible circuit board is disposed on a side of the driver chip facing away from the display region; and the first metal wire and the second metal wire are linear.

15. The display device according to claim 1, comprising a display region and a non-display region at least partially surrounding the display region, wherein the non-display region comprises a first non-display region and a second non-display region opposite to each other along a second direction and a third non-display region and a fourth non-display region opposite to each other along a first direction, and the first direction intersects the second direction;

the third non-display region is bonded to the driver chip, and the first non-display region is bonded to the flexible circuit board; and the first metal wire and the second metal wire extend in a zigzag shape along the display region.

16. The display device according to claim 15, wherein the metal layer comprises at least a first metal layer and a second metal layer;

the first metal wire sequentially comprises a first sub-metal wire extending along the second direction, a second sub-metal wire extending along the first direction, and a third sub-metal wire extending along the second direction; and the second metal wire sequentially comprises a fourth sub-metal wire extending along the second direction, a fifth sub-metal wire extending along the first direction, and a sixth sub-metal wire extending along the second direction;

the first sub-metal wire, the third sub-metal wire, the fourth sub-metal wire, and the sixth sub-metal wire are located in the first metal layer, and the second sub-metal wire and the fifth sub-metal wire are located in the second metal layer; and the first sub-metal wire is electrically connected to the second sub-metal wire through a first via, the third sub-metal wire is electrically connected to the second sub-metal wire through a second via, the fourth sub-metal wire is electrically connected to the fifth sub-metal wire through a third via, and the fifth sub-metal wire is electrically connected to the sixth sub-metal wire through a fourth via.

17. The display device according to claim 16, wherein the first via and the third via have a same aperture, and the second via and the fourth via have a same aperture, or, wherein the first sub-metal wire and the fourth sub-metal wire have a same wire width;

the second sub-metal wire and the fifth sub-metal wire have a same wire width; and the third sub-metal wire and the sixth sub-metal wire have a same wire width.

18. The display device according to claim 15, wherein along the first direction, the second circuit board pad is disposed on a side of the first circuit board pad facing away from the display region; and along the first direction, the fourth circuit board pad is disposed on a side of the third circuit board pad facing an edge of the flexible circuit board.

19. A test method for a display device, the test method being applicable to the display device according to claim 1 and comprising:

measuring a first resistance value R1 of the first test loop in the display device through the first test terminal and the second test terminal;

measuring a second resistance value R2 of the second test loop in the display device through the third test terminal and the fourth test terminal; and acquiring a bonding resistance value R of the first chip pad of the driver chip of the display device according to the first resistance value R1 and the second resistance value R2, wherein $R=(R1-R2)/2$.

20. The test method for a display device according to claim 19, wherein measuring the first resistance value R1 of the first test loop in the display device through the first test terminal and the second test terminal comprises:

connecting a multimeter to the first test terminal and the second test terminal separately to acquire the first resistance value R1; and measuring the second resistance value R2 of the second test loop in the display device through the third test terminal and the fourth test terminal comprises:

connecting the multimeter to the third test terminal and the fourth test terminal separately to acquire the second resistance value R2.

* * * * *